(12) United States Patent
Siragusa

(10) Patent No.: US 9,148,161 B2
(45) Date of Patent: *Sep. 29, 2015

(54) PIPELINED ADC HAVING ERROR CORRECTION

(71) Applicant: Analog Devices, Inc., Norwood, MA (US)

(72) Inventor: Eric John Siragusa, San Diego, CA (US)

(73) Assignee: ANALOG DEVICES, INC., Norwood, MA (US)

( * ) Notice: Subject to any disclaimer, the term of this patent is extended or adjusted under 35 U.S.C. 154(b) by 81 days.

This patent is subject to a terminal disclaimer.

(21) Appl. No.: 13/741,078

(22) Filed: Jan. 14, 2013

(65) Prior Publication Data

US 2013/0135127 A1 May 30, 2013

Related U.S. Application Data

(63) Continuation of application No. 13/077,753, filed on Mar. 31, 2011, now Pat. No. 8,368,571.

(51) Int. Cl.
*H03M 1/10* (2006.01)
*H03M 1/06* (2006.01)
*H03M 1/16* (2006.01)

(52) U.S. Cl.
CPC .......... *H03M 1/1009* (2013.01); *H03M 1/1033* (2013.01); *H03M 1/0695* (2013.01); *H03M 1/168* (2013.01)

(58) Field of Classification Search
CPC . H03M 1/1004; H03M 1/168; H03M 1/1033; H03M 1/1038; H03M 1/1061; H03M 1/145; H03M 1/167; H03M 1/0695; H03M 1/1009; H03M 1/1023; H03M 1/1215; H03M 1/123; H03M 1/164; H03M 1/46; H03M 1/68
USPC .......................... 341/118, 120, 155, 161, 162
See application file for complete search history.

(56) References Cited

U.S. PATENT DOCUMENTS

| | | | |
|---|---|---|---|
| 6,456,223 B1 * | 9/2002 | Yu et al. ....................... 341/161 |
| 6,515,611 B1 * | 2/2003 | Fetterman et al. ............ 341/161 |
| 6,784,814 B1 | 8/2004 | Nair et al. |
| 7,006,028 B2 | 2/2006 | Galton |

(Continued)

OTHER PUBLICATIONS

PCT International Search Report and Written Opinion from PCT/US12/31578, mailed on Jun. 15, 2012.

*Primary Examiner* — Linh Nguyen
(74) *Attorney, Agent, or Firm* — Kenyon & Kenyon LLP

(57) ABSTRACT

A stage of a pipelined analog-to-digital converter can include first and second pluralities of digital-to-analog converters (DACs), the first plurality sufficient in number to produce a residue from the stage, the second plurality having their outputs added into an analog output of the stage. A mapping circuit can exchange inputs between selected ones of the first and second pluralities of DACs, and a calibration circuit can provide first and second calibration signals to the selected one of the first plurality and another of the second plurality of DACs. The calibration signals can correlate to each other, but be uncorrelated to an analog input and digital output of the stage, and have unequal and partially offsetting effects on the stage's residue. A correction circuit can correct the digital output of the stage for circuit path errors based on a correlation between the calibration signals and an output of a succeeding stage.

30 Claims, 10 Drawing Sheets

(56) References Cited

U.S. PATENT DOCUMENTS

| | | |
|---|---|---|
| 7,107,175 B2 * | 9/2006 | Maloberti et al. ............ 702/126 |
| 7,129,874 B2 * | 10/2006 | Bjornsen ........................ 341/143 |
| 7,142,138 B2 | 11/2006 | Chen et al. |
| 7,280,064 B2 * | 10/2007 | Lin ................................ 341/155 |
| 7,602,323 B2 | 10/2009 | Galton et al. |
| 7,688,238 B2 | 3/2010 | Lewis et al. |
| 7,719,452 B2 * | 5/2010 | Bardsley et al. .............. 341/131 |
| 7,786,910 B2 * | 8/2010 | Ali et al. ....................... 341/131 |
| 7,898,452 B2 | 3/2011 | Lewis et al. |
| 7,986,250 B2 | 7/2011 | Galton et al. |
| 8,068,045 B2 * | 11/2011 | Ali et al. ....................... 341/131 |
| 8,184,033 B2 * | 5/2012 | Wang et al. .................... 341/161 |
| 8,368,571 B2 * | 2/2013 | Siragusa ....................... 341/120 |
| 2002/0041247 A1 | 4/2002 | Steensgaard-Madsen |
| 2005/0156773 A1 | 7/2005 | Galton |
| 2005/0275572 A1 | 12/2005 | Bjornsen |
| 2008/0258949 A1 | 10/2008 | Galton et al. |
| 2011/0199244 A1 | 8/2011 | Erdmann et al. |
| 2012/0212358 A1 | 8/2012 | Shi et al. |

\* cited by examiner

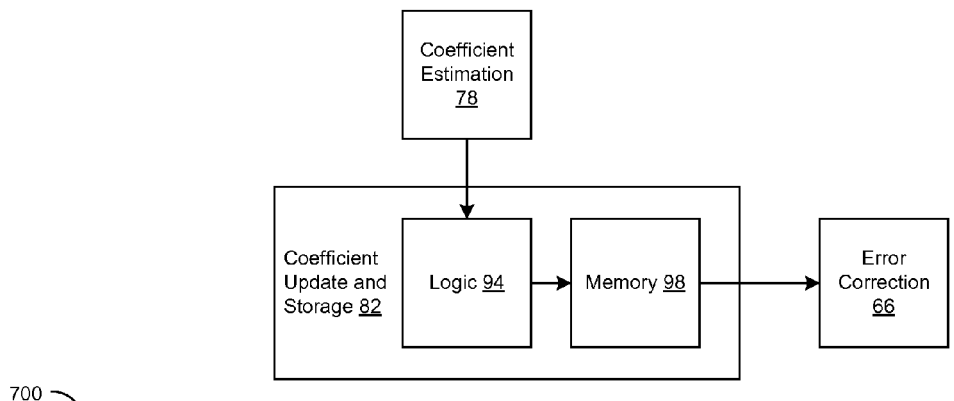
FIG. 5
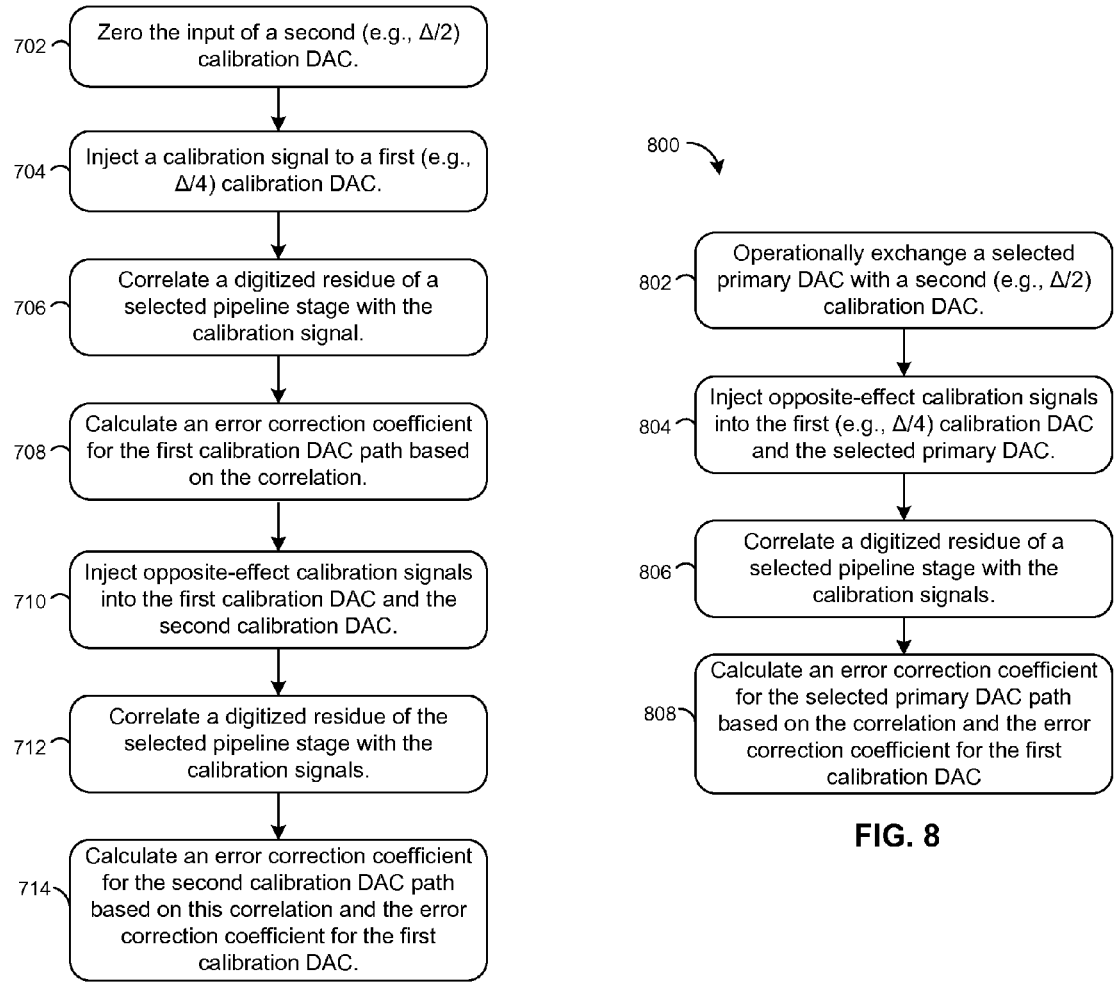
FIG. 7
FIG. 8

PIPELINED ADC HAVING ERROR CORRECTION

CROSS-REFERENCE TO RELATED APPLICATIONS

This application is a continuation of, and claims priority to, U.S. patent application Ser. No. 13/077,753, filed on Mar. 31, 2011, which is hereby incorporated by reference in its entirety.

BACKGROUND INFORMATION

Pipelined analog-to-digital converters (ADCs) represent one popular ADC architecture. FIG. 1 depicts an embodiment of a typical pipelined ADC 20, configured to convert an analog input signal AIN to a digital output signal DOUT, that includes a plurality of pipeline stages 24, each stage 24 receiving an individual analog input signal AI and generating an individual digital output signal DO, an analog output signal AO, an analog residue signal AR, and an amplified analog residue signal AAR, which is converted to a corresponding digitized residue DR. Each stage can include an ADC subcircuit 28 to generate the digital output DO, a digital-to-analog converter (DAC) 32 to generate the analog output AO, and a summation circuit 36 and amplifier circuit 40 to generate the analog residue AR and amplified analog residue AAR. The digital output DO of each stage 24 represents a digitization, at a predetermined bit width, of the analog input AI received by that stage 24. The analog output AO represents a conversion of the digital output DO of that stage 24 back into analog form. The analog residue AR is a subtraction of the analog output AO from the analog input AI of that state 24, and represents the unconverted remainder of the analog input AI received by the stage 24. The digitized residue DR returned to a given stage 24 represents a digitization of the analog residue AR by succeeding stages 24.

In operation, the pipelined ADC 20 converts the overall analog input AIN delivered to the first stage 24 by successively approximating in turn the analog input AI at each stage 24, to the predetermined bit width of that stage 24, then generating and amplifying the analog residue AR representing the unconverted remainder of the analog input AI at that stage 24, and passing the amplified residue AAR to the next stage 24 and repeating the process. Ultimately, the ADC 20 can convert the original analog input AIN by combining the digital output DO produced by each of the individual stages 24, which can be performed by a delay and combine circuit 44, to successively build corresponding digitized residues DR into the overall digital output DOUT. In embodiments, overlap of the digital output DO between individual pipeline stages 24 can be used to improve accuracy of the overall pipelined ADC 20.

Problems exist, however, with the pipelined ADC architecture 20 depicted in FIG. 1. Inaccuracies in the generation of the amplified analog residue AAR can limit the accuracy with which the ADC 20 as a whole operates, as later pipeline stages 24 will thereby convert an inaccurate remainder. This can manifest in reduced ADC performance parameters, such as SNR, linearity, etc. Two mechanisms that can reduce the accuracy of the generation of the amplified analog residue AAR include a gain error in the amplifier 40 that amplifies the analog residue AR and component-value mismatches within the DAC 32 that generates the analog output AO from the digital output DO. First, in regard to gain error, the amplifier circuit 40 amplifies the analog residue AR by a predetermined gain to utilize more of the full scale of the input of succeeding pipeline stages 24. However, an error in the predetermined gain of the amplifier circuit 40 sends an erroneous amplified residue AAR to succeeding pipeline stages 24. Second, in regard to DAC mismatch error, the DAC 32 generates the analog output AO from the digital output DO, and the analog output AO is in turn used to generate the analog residue AR. However, many DACs 32 utilize capacitor or resistor arrays, or other component arrangements, the constituent components of which having predetermined component-value relationships, and deviation from these predetermined value relationships, as can result from manufacturing inaccuracies, can reduce the accuracy with which the analog output AO, and ultimately the analog residue AR, is produced.

Large capacitors and high power amplifiers have sometimes been used to mitigate these problems. However, these approaches can undesirably consume chip area and power, and may not even fix all of the above errors. Therefore, a need exists for a pipelined ADC architecture having a mechanism to correct for errors such as residue amplifier gain errors and DAC component-value mismatch errors, while not unnecessarily introducing space-consuming or overly complicated or power consuming circuitry.

BRIEF DESCRIPTION OF THE DRAWINGS

So that features of the present invention can be understood, a number of drawings are described below. However, the appended drawings illustrate only particular embodiments of the invention and are therefore not to be considered limiting of its scope, for the invention may encompass other equally effective embodiments.

FIG. 5 is a circuit schematic depicting an embodiment of an update and storage circuit of the pipelined ADC circuit depicted in FIGS. 2-4.

FIG. 7 is a flowchart depicting an embodiment of a method for calibrating an injection pipeline stage to account for residue-amplifier gain error.

FIG. 8 is a flowchart depicting an embodiment of a method for calibrating an injection pipeline stage to account for DAC component-value mismatch error.

DETAILED DESCRIPTION OF EXAMPLE EMBODIMENTS

Figure 2:
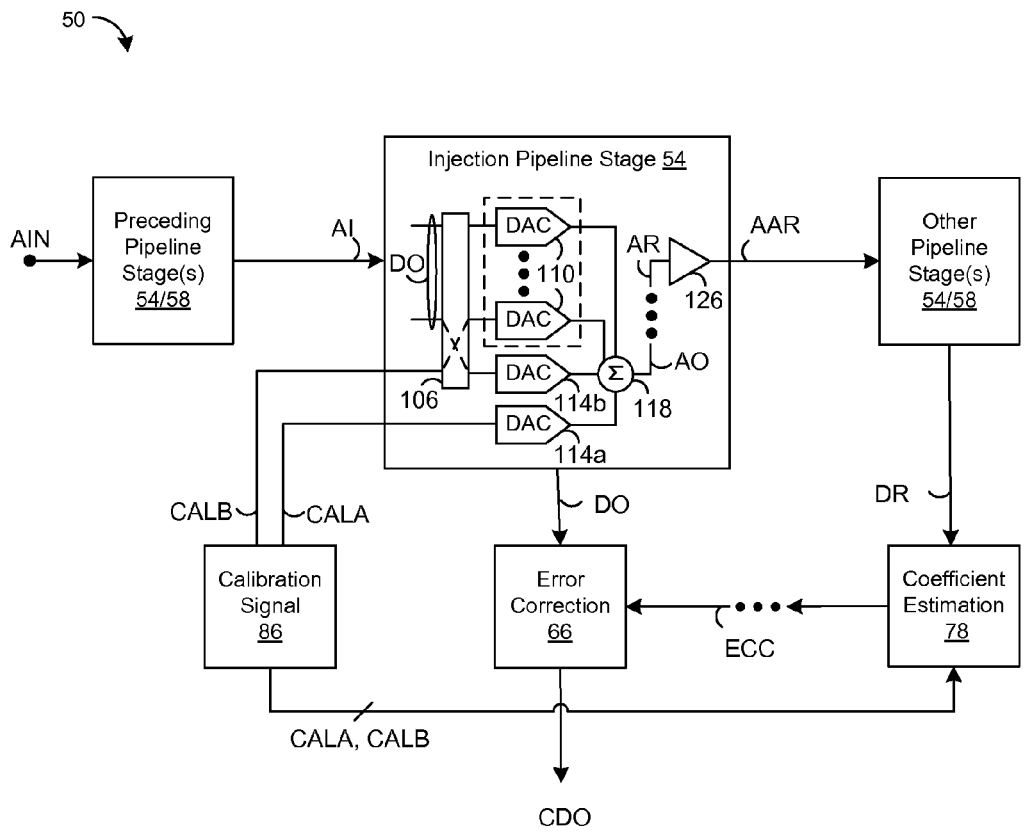
FIG. 2 is a circuit schematic depicting an embodiment of another pipelined ADC circuit.

FIG. 2 depicts elements of an embodiment of a pipelined ADC circuit 50 having a plurality of pipeline stages 54, 58, including one or more calibrated pipeline stages 54, also referred to herein as injection pipeline stages 54, which may be calibrated to correct its digital output for errors such as residue-amplifier gain errors and digital-to-analog-converter (DAC) component-value mismatch errors. The calibrated pipeline stage 54 can include a plurality of DACs 110, also referred to herein as primary DACs 110, sufficient in number to convert a digital output DO generated by that stage 54 into a corresponding analog output AO of that stage 54, and two or more additional DACs 114, also referred to herein as calibration DACs 114, for calibrating the selected stage 54 to correct for errors including residue-amplifier gain errors and component-value mismatch errors of that stage 54. The pipelined ADC circuit 50 can measure the gain imparted by each path through a primary DAC to the digitized residue of a selected injection stage and compare that to the expected ideal gain of that path. Each primary DAC path may contain errors common to all the DAC paths, such as gain errors in the residue amplifier or effective gain errors of the backend stages, as well as errors unique to each individual primary DAC path, such as due to unintended differences between and among the primary DACs. The pipelined ADC circuit 50 can then estimate and apply error correction coefficients to fix both types of errors for each primary DAC path. Note that FIG. 2 only depicts selected elements of the pipelined ADC circuit 50 for simplicity. Embodiments of the pipelined ADC 50 can include further elements as depicted in other figures and discussed in more detail below.

In a first calibration method 700 (also shown in, and discussed in more detail below in reference to, FIG. 7), first and second calibration DACs 114a, 114b can be calibrated to correct for errors in circuit paths through the calibration DACs to the corresponding digitized residue DR of the selected stage. A first of the calibration DACs 114a can be provided, i.e., injected, with a first calibration signal CALA at its input. The first calibration signal CALA can be configured to be uncorrelated to any concurrently received analog input AI being processed by concurrent regular conversion operation of the selected stage 54, as well as to correspondingly produced digital output DO. The injected first calibration signal CALA can be processed by and produce an output from the first calibration DAC 114a that can be summed by a summation circuit 118, along with any other outputs generated by regular conversion operation of the primary DACs 110, to produce an analog output AO that can be subtracted (not shown in FIG. 2) from the analog input AI received by that stage 54 to generate an analog residue AR, which can be passed to and amplified by the residue amplifier 126 to generate the amplified analog residue AAR passed to the succeeding pipeline stage 54, 58 (which can be either a calibrated pipeline stage 54 or other pipeline stage 58). The corresponding digitized residue DR produced by the succeeding pipeline stage 54, 58 can then be passed to a coefficient estimation circuit 78 that can correlate the digitized residue DR to the injected calibration signal CALA to determine the injected signal's effect on the digitized residue DR, and thus any deviation from an intended gain of the circuit path through the first calibration DAC 114a and the residue amplifier 126 and on to the digitized residue DR. This correlation can separate the effect of the calibration signal CALA on the digitized residue DR from the effect of any other signals generated by the primary DACs 110 during regular conversion operation due to the lack of correlation between the calibration signal CALA and the other regular conversion operation signals produced by the primary DACs 110. The coefficient estimation circuit 78 can then generate and pass on a calibration DAC error correction coefficient CDECC to an error correction circuit 66 for use in correcting the digital output DO of the selected pipeline stage 54 for errors in the first calibration DAC path. The calibration of the first calibration DAC 114a can occur in either a foreground or a background calibration mode, i.e., either not during or during regular conversion operation of the selected stage 54, as the relative size of the output of the first calibration DAC 114a, e.g., ±Δ/4, can be small enough to not overwhelm the available input headroom of the succeeding pipeline stage 54, 58.

Continuing with first calibration method 700, once the first calibration DAC 114a is calibrated, it can now be used to calibrate the circuit path including the second calibration DAC 114b, e.g., in either a foreground or background calibration mode. The second calibration DAC 114b and first calibration DAC 114a can be simultaneously provided, i.e., injected, with first and second calibration signals CALA, CALB at their inputs. The first and second calibration signals CALA, CALB can be uncorrelated to any concurrently received analog input AI being processed by regular conversion operation of the selected stage 54 to produce corresponding digital outputs DO, but correlated to each other so that they can produce correlated although unequal effects on the digitized residue DR corresponding to the selected pipeline stage 54. For example, the first calibration signal CALA may equal the opposite or inverse of the second calibration signal CALB, e.g., CALA=−CALB, where the first and second calibration signals CALA, CALB can be composed of elements from a set represented by {−1, 1}. The coefficient estimation circuit 78 can correlate the corresponding digitized residue DR to the injected calibration signals CALA, CALB to determine the injected signals' effect on the digitized residue DR. Since the path error of the first calibration DAC 114a has already been estimated, this estimate and the known calibration signals CALA, CALB can be used to remove the effects of the path error of the first calibration DAC 114a either before or after performing a correlation operation for the path of the second calibration DAC 114b, thus isolating the path error for the second calibration DAC 114b. Thus any remaining deviation is from an intended gain of the circuit path through the second calibration DAC 114b, residue amplifier 126 and any succeeding stages 54, 58. The coefficient estimation circuit 78 can then generate and pass on a calibration DAC error correction coefficient CDECC to an error correction circuit 66 for use in correcting the digital output DO of the selected pipeline stage 54 for errors in the circuit path including the second calibration DAC 114b.

In a second calibration method 800 (also shown in, and discussed below in more detail in reference to, FIG. 8), which can be performed after the first calibration method 700, and in either a foreground or background mode, a second of the calibration DACs 114b can be operationally exchanged with a selected one of the primary DACs 110, so that the second calibration DAC 114b assumes the place of the selected primary DAC 110 in the operation of the primary DACs 110 to convert the digital output DO of the selected stage 54 to a corresponding analog output AO. This operational exchange can be accomplished with a mapping circuit 106, which can exchange, i.e., map, inputs between the selected primary DAC 110 and the second calibration DAC 114b. The selected primary DAC 110 and first calibration DAC 114a can then be simultaneously provided, i.e., injected, with first and second calibration signals CALA, CALB at their inputs, the first and second calibration signals CALA, CALB being uncorrelated to any concurrently received analog input AI being processed by concurrent regular conversion operation of the selected stage 54 to produce corresponding digital outputs DO, but correlated to each other so that they can produce correlated although unequal effects on the digitized residue DR ultimately generated corresponding to the selected stage 54.

In more detail, e.g., in a background mode, the first and second calibration signals CALA, CALB can be processed by the first calibration DAC 114a and selected primary DAC 110, and their outputs then summed by the summation circuit 118 along with any other outputs generated by regular conversion operation of the primary DACs 110 and exchanged second calibration DAC 114b. This analog output sum AO can be subtracted from the analog input AI received by that stage and the resulting analog residue AR can be amplified by the residue amplifier 126 to generate the amplified analog residue AAR. The calibration DACs 114 and summation circuit 118 can be configured so that the injection of the first and second calibration signals CALA, CALB into the first calibration DAC 114a and selected primary DAC 110 produces effects on the amplified analog residue AAR, and thus the corresponding digitized residue DR, that are correlated but unequal to each other and uncorrelated to other analog signals being generated by the remaining unselected primary DACs 110 and substituted second calibration DAC 114b during regular conversion operation. This correlated but unequal effect can be achieved in a number of ways, e.g., by providing correlated and equal or unequal first and second calibration signals CALA, CALB which can be processed in the same way or different ways by the first calibration DAC 114a and selected primary DAC 110 and summation circuit 118. The result can be that an effect of the correlated first and second calibration signals CALA, CALB can be determined in the corresponding digitized residue DR generated by the succeeding pipeline stages 54, 58 by the coefficient estimation circuit 78 that correlates the digitized residue DR to the injected calibration signals CALA, CALB to separate out the effect of any uncorrelated regular conversion signals. Because the first and second calibration signals CALA, CALB can have correlated but unequal effect upon the amplified analog residue AAR produced by the selected pipeline stage 54, the overall size of the combined effect of the two calibration signals CALA, CALB on the amplified analog residue AAR can be tailored, e.g., by configuring the effect of one of the calibration signals CALA, CALB to partially offset and reduce the effect of the other calibration signal CALA, CALB on the amplified analog residue AAR, so that the analog input headroom of the succeeding stage 54, 58 can be conserved, which can allow the second calibration method 800 to be performed in a background mode, i.e., concurrent to regular conversion operation of the pipelined ADC circuit 50, and can also have benefits for foreground mode calibration. The coefficient estimation circuit 78 can calculate any deviation from intended component values of the circuit path including the selected primary DAC 110 based the injected signals' effect on the digitized residue DR produced by the succeeding stage 54, 58, and generate and pass on a primary DAC error correction coefficient PDECC to the error correction circuit 68 for use in correcting the digital output DO of the selected pipeline stage 54 for errors in the circuit path including the selected primary DAC 110, such as residue amplifier gain errors and component value mismatch errors. The error correction coefficients ECC depicted in FIG. 2 can thus include both primary DAC correction coefficients PDECC, also shown in FIG. 16, and calibration DAC error correction coefficients CDECC, also shown in FIG. 16.

While FIG. 2 depicts an overview of aspects of the pipelined ADC circuit 50 and its operation, more detailed embodiments are discussed below in reference to further depictions in the figures.

Figure 1:
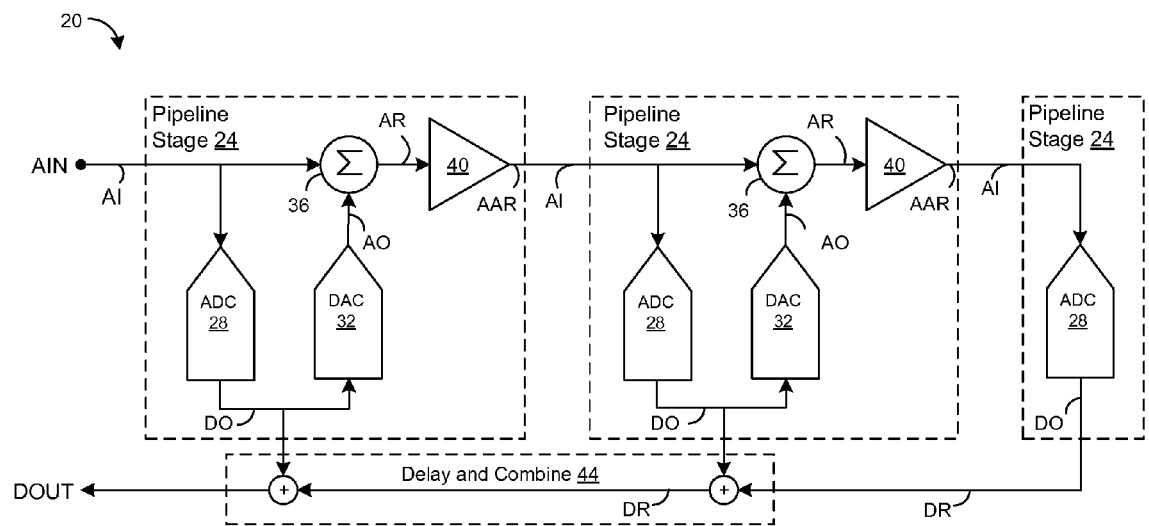
FIG. 1 is a circuit schematic depicting an embodiment of a pipelined ADC circuit.
Figure 3:
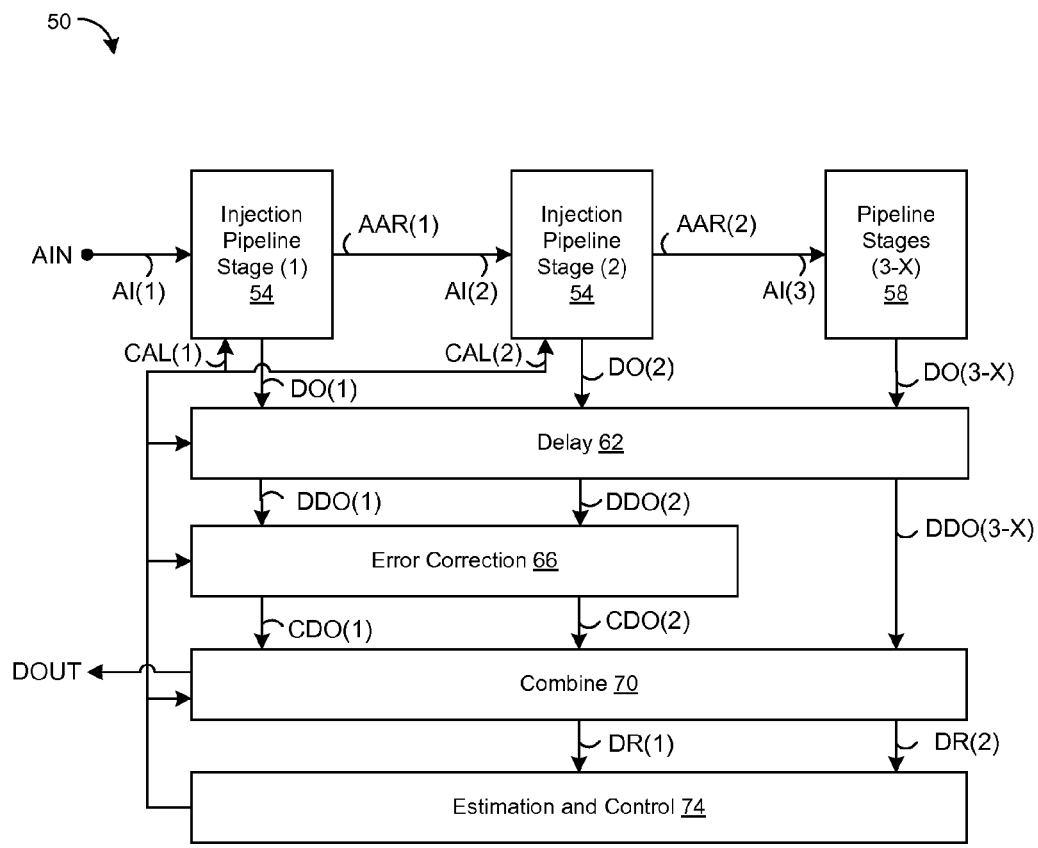
FIG. 3 is a circuit schematic depicting an embodiment of the pipelined ADC circuit depicted in FIG. 2.

FIG. 3 depicts an embodiment of the pipelined ADC circuit 50, which may correct errors such as residue-amplifier gain errors, DAC component-value mismatch errors, and other types of errors, showing the overall high level architecture of the pipelined ADC circuit 50. The pipelined ADC 50 can include one or more injection pipeline stages 54 configured to receive calibration signal injection, one or more pipeline stages 58 that optionally omit calibration-signal injection configurations, a delay circuit 62, an error correction circuit 66, a combine circuit 70, and an estimation and control circuit 74. Each injection pipeline stage 54 may perform a calibration procedure to correct for errors such as residue-amplifier gain errors and DAC component-value mismatch errors of that injection stage 54. The other pipeline stages 58 in FIG. 3, optionally omitting calibration injection configurations, can be configured as the pipeline stages 24 depicted in the architecture 20 of FIG. 1, or configured according to various other considerations. The estimation and control circuit 74 may perform the error estimation function, and provide injection, control and clock signals to the other circuits of the pipelined ADC circuit 50, to enable operation of the ADC circuit 50 as described herein. The delay circuit 62 may produce delayed digital outputs DDO of each of the plurality of pipeline stages 54, 58 so that correction of the digital outputs DO of the injection pipeline stages 54 and combination of these corrected digital outputs CDO with the digital outputs DO of the other stages can occur within the context of the sequential nature of pipelined ADC operation. The error correction circuit 66 may produced the corrected digital outputs CDO, correcting the digital outputs DO of the injection pipeline stages 54 for residue-amplifier gain errors and DAC component-value mismatch errors of the injection stages 54 according methodology and circuits discussed further herein. The combine circuit 70 may combine the corrected digital outputs CDO from the injection stages 54 with the delayed digital outputs DDO from the other pipeline stages 58 to produce the digitized residues DR and overall digital output DOUT of the pipelined ADC circuit 50.

Although FIG. 3 depicts an embodiment of the pipelined ADC 50 having two injection pipeline stages 54 and an arbitrary number of uninjected pipeline stages 58, other configurations of the pipelined ADC 50 are possible. For example, embodiments of the pipelined ADC 50 can include one or more injection pipeline stages 54 in combination with zero, one or a plurality of uninjected pipeline stages 58. Additionally, although FIG. 3 depicts an exemplary arrangement of the delay circuit 62, error correction circuit 66, combine circuit 70 and estimation and control circuit 74, other arrangements of these circuits are possible. For example, embodiments of the ADC can include one or more of the delay circuit 62, error correction circuit 66, combine circuit 70 and estimation and control circuit 74 interconnected with others of these circuits in a different order than that shown in FIG. 3, e.g., to implement a different sequence of digital signal flow through these circuits, such as delaying after error correcting, instead of before, etc., and still accomplish the error correction functionality of the pipelined ADC circuit 50 as discussed herein. The error correction can optionally correct the digital output DO through either a digital manipulation or an analog manipulation to fully or partially correct for the circuit path errors estimated herein, such as, e.g., by digitally altering the digital output DO, by altering an amplification applied to an analog signal (e.g., the analog output AO, analog residue AR, etc.), by changing a bias current in an analog component to alter its behavior, or any combination of these manipulations, in response to error correction coefficients calculated herein.

Figure 4:
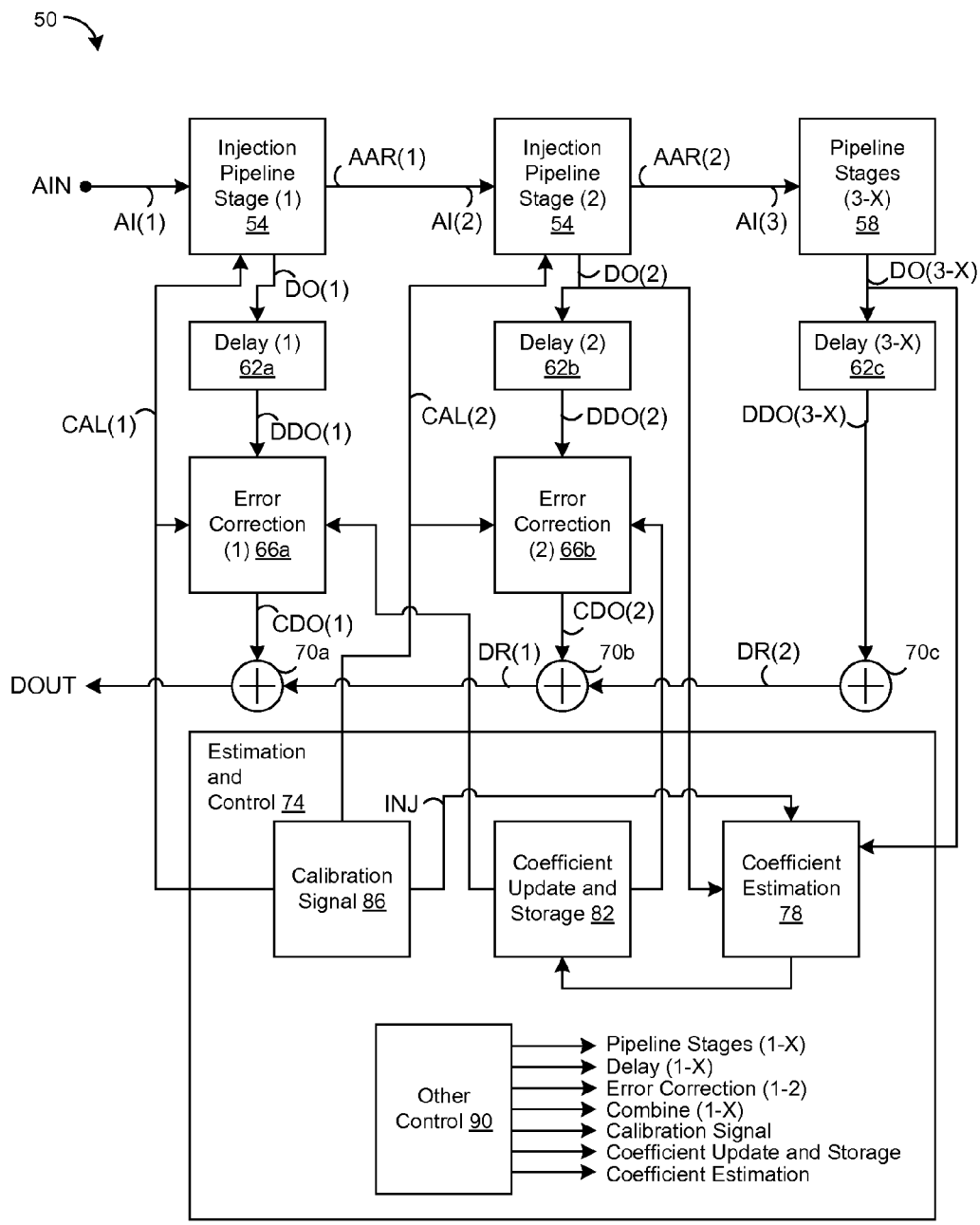
FIG. 4 is a circuit schematic depicting an embodiment of the pipelined ADC circuit of FIGS. 2 and 3, showing greater detail with respect to certain portions of the pipelined ADC circuit.

FIG. 4 depicts an embodiment of the pipelined ADC 50 depicted in FIG. 3 and shows additional detail regarding some of the circuits in FIG. 3. In FIG. 4, the estimation and control circuit 74 may include an error correction coefficient estimation circuit 78, an error correction coefficient update and storage circuit 82, a calibration signal circuit 86, and other control circuits 90. Also in FIG. 4, the delay circuit 62, error correction circuit 66, and combine circuit 70 may include portions (labeled 62*a-c*, 66*a-c*, 70*a-c*) corresponding to respective injection or uninjected pipeline stages 54, 58.

The error correction coefficient estimation circuit 78 may estimate and supply to the coefficient update and storage circuit 82 error correction coefficients based on the digitized residue DR corresponding to selected calibration pipeline stages 54. The error correction coefficients can include coefficients corresponding to and for use by the error correction circuits 66*a*, 66*b* corresponding to each of the injection pipeline stages 54 to correct for errors such as residue-amplifier gain and DAC component-value mismatch errors of that stage 54. The error correction coefficients can optionally take the form of digital bits or words of predetermined bit lengths, or any other form suitable for storing a quantitative value used by digital circuits. The coefficient estimation circuit 78 can estimate error correction coefficients for a particular injection pipeline stage 54 based on the digitized residue DR corresponding to that stage 54, which is the combination of the digital outputs DO from the succeeding pipeline stages, whether they be of injection pipeline stages 54, uninjected pipeline stages 58, or a mix of both. For example, in FIG. 4, the coefficient estimation circuit 78 may estimate error correction coefficients for correcting errors of the first injection pipeline stage (labeled with a (1) in FIG. 4) based on a calibration signal injected into that stage 54 and a digitized residue DR (labeled with a (1) in FIG. 4) corresponding to that stage 54. Similarly, for the second injection pipeline stage 54, the coefficient estimation circuit 78 may estimate error-correction coefficients based on the calibration signal injected into that stage 54 and the digitized residue DR (labeled with a (2) in FIG. 4) corresponding to that stage 54. The coefficient estimation circuit 78 can provide the estimated error correction coefficients to the coefficient update and storage circuit 82.

The error correction coefficient update and storage circuit 82 may receive the error-correction coefficients estimated by the coefficient estimation circuit 78, update existing error correction coefficients, store received error correction coefficients, and provide the respective received or stored error correction coefficients to the error correction circuit of each injection pipeline stage 54. FIG. 5 depicts an embodiment of the update and storage circuit 82, which can include a logic circuit 94 and a memory 98. The logic circuit 94 may implement one or more update operating modes as described herein. Upon receiving error correction coefficients from the coefficient estimation circuit 78, the coefficient update and storage circuit 82 may automatically store the coefficients, thereby updating the corresponding stored coefficients, or store the received coefficients based on an operational or logical decision. For example, the update and storage circuit 82 can optionally update the coefficients at predetermined or selectively configurable times or update rates. An update rate can optionally be the same or different than the rate at which the coefficient estimation circuit 78 may estimate new values of the coefficients. The coefficient update rate can also be selected to variously correspond with foreground or background operational modes of the pipelined ADC circuit 50, as discussed further below. The memory 98 of the update and storage circuit 82 may store the received error correction coefficients according to the update operating mode selected and implemented by the update logic circuit 94 and other control circuits 90. The memory 98 can include one or more of latches, registers, ROM, RAM, EEPROM, or any other integrated circuit memory structure that can store digital information. The memory 98 can supply stored error correction coefficients to corresponding error correction circuits 66 according to the operation of the pipelined ADC described herein, as selected and implemented by the update logic circuit 94 and other control circuits 90.

Returning to FIG. 4, the calibration signal circuit 86 may supply calibration signals CAL of predetermined types to selected injection pipeline stages 54. The supplied calibration signals CAL can be used to calibrate a selected injection pipeline stage 54 by generating a corresponding digitized residue DR produced by succeeding pipeline stages and calculating error correction coefficients for the selected injection stage 54 based on the digitized residue DR and the calibration signal CAL supplied to the selected stage 54. The calibration signal CAL can be selected to be of a type to facilitate the calculation of error coefficients. In one embodiment, the calibration signal CAL can be uncorrelated to any analog input signals AI concurrently received and processed by the selected injection pipeline stage 54, e.g., as part of regular conversion operation of the pipelined ADC 50, or any other analog or digital signals of the selected stage 54, or portion thereof, produced as a result of such received analog input signals AI. The digitized residue DR produced by the stages succeeding the selected injection stage 54, and corresponding to the selected stage 54, can thereby have a component correlated only to the calibration signal CAL. The corresponding digitized residue DR can thus be analyzed by correlation to the calibration signal CAL injected into the selected injection stage 54 to determine the effect of errors, such as residue-amplifier gain errors and DAC component-value mismatch errors, of the selected injection stage 54. The calibration signal CAL can generally be injected into the selected injection pipeline stage 54 in a foreground mode, i.e., not simultaneous in time with receipt by the selected injection stage 54 of a regular analog input signal AI during operation of the selected injected stage 54, the pipelined ADC circuit 50, or both, to convert received analog input signals AI, AIN to digital output signals DO, DOUT, and uncorrelated embodiments of the calibration signal CAL can be injected into the selected injection pipeline stage 54 in both foreground and background modes, i.e., either not simultaneous or simultaneous in time with receipt by the selected injection stage 54 of an analog input signal AI during operation of the selected injection stage 54, the pipelined ADC circuit 50, or both, to convert received analog input signals AI, AIN to digital output signals DO, DOUT.

Uncorrelated embodiments of the calibration signal CAL may have various forms. In one embodiment, the uncorrelated calibration signal CAL can include a pseudo-random binary signal, a zero-mean binary signal, a zero-mean pseudo-random binary signal, or combinations thereof.

The calibration signal circuit 86 may internally generate the calibration signals CAL (e.g., an uncorrelated pseudo-random signal) and provide the calibration signals CAL to the injection pipeline stages 54, or receive the calibration signals CAL from another circuit and provide the received calibration signals CAL to the injection pipeline stages 54. The calibration signal circuit 86 can also provide the calibration signals CAL that it provided to the injection pipeline stages 54 to the coefficient estimation circuit 78 for correlation-based estimation of the error correction coefficients for each of the injection pipeline stages 54. The calibration signal circuit 86 can use a single calibration signal CAL for all injection pipeline stages 54, use different calibration signals CAL for each pipeline stage 54, or a combination of these approaches.

The other control circuitry 90 may provide other control and clock signals as necessary to other circuits of the pipelined ADC circuit 50, including the injection and uninjected pipeline stages 54, 58, the delay circuit 62, the error correction circuit 66, the combine circuit 70, the calibration signal circuit 86, the coefficient update and storage circuit 82 and the coefficient estimation circuit 78, etc., to enable operation of the pipelined ADC circuit 50 as described herein. These control and clock signals can control the operation of the pipelined ADC circuit 50 according to selected operation modes, e.g., such as foreground or background calibration modes, and can include logic-triggered control and clock signals.

Figure 6:
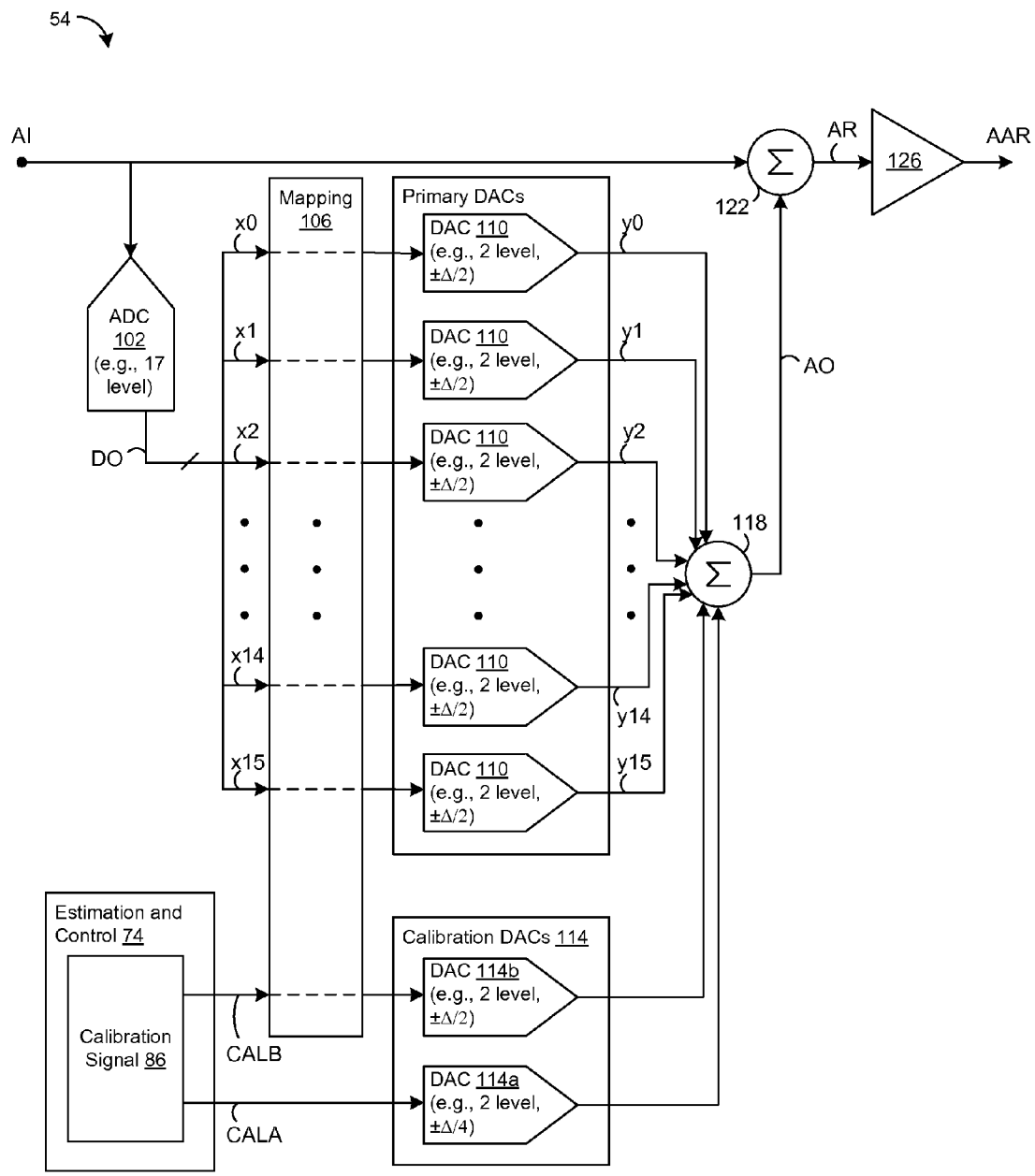
FIG. 6 is a circuit schematic depicting an embodiment of an injection pipeline stage of the pipelined ADC circuit depicted in FIGS. 2-4.

FIG. 6 depicts an embodiment of an injection pipeline stage 54 and portions of the estimation and control circuit 74 of the pipelined ADC circuit 50 depicted in FIGS. 2-4. The injection pipeline stage 54 may include an ADC subcircuit 102, a mapping circuit 106, one or more primary DACs 110, one or more calibration DACs 114, one or more summation circuits 118, 122, and an amplifier 126. The ADC subcircuit 102 may convert the analog input AI received by the injection pipeline stage 54 to a digital output DO corresponding to a predetermined number of digital binary-code bits. In FIG. 6, the depicted exemplary embodiment generates a digital output DO corresponding to a 4 bit binary code. The ADC subcircuit 102 can optionally be configured to produce either a binary-code output or a unary code, i.e., thermometer code, output. In FIG. 6, the exemplary ADC subcircuit 102 is configured to provide a thermometer code digital output DO to the mapping circuit, and thus, for a digital output corresponding to a 4 bit binary-code digital word, the ADC subcircuit 102 can provide a digital output DO that includes sixteen thermometer-code digital signals x0-x15. Embodiments of the ADC subcircuit 102 can optionally be configured to produce a binary-code digital output DO, a thermometer-code digital output DO, or both.

Figure 10:
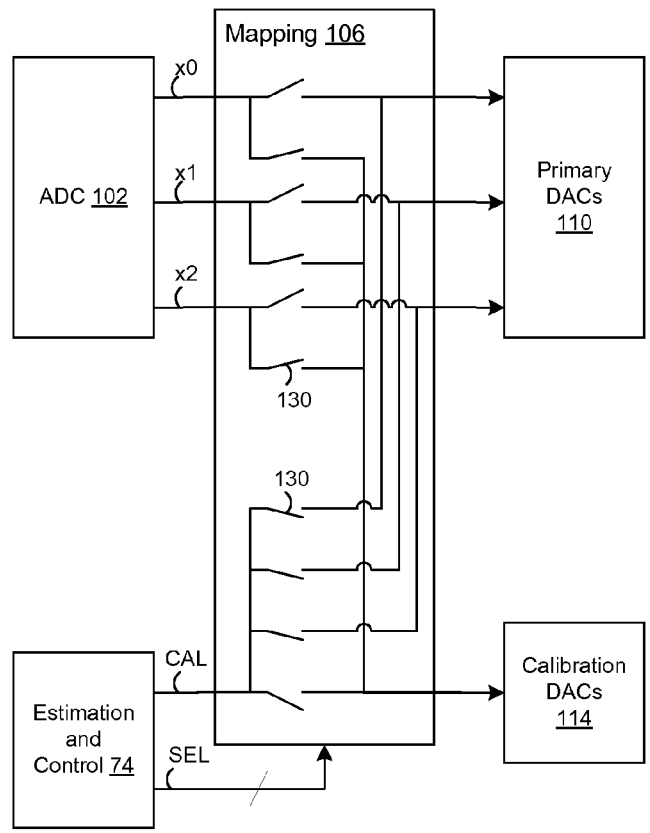
FIG. 10 is a circuit schematic depicting an embodiment of a mapping circuit of the injection pipeline stage depicted in FIG. 6.

The injection pipeline stage 54 can include the mapping circuit 106 to implement selectable routing of the digital output DO and calibration signals CAL from the ADC subcircuit 102 and calibration signal circuit 86 of the estimation and control circuit 74 to the primary and calibration DACs 110, 114. The mapping circuit can be configured, as indicated by the dashed-line portions of the mapping circuit in the depicted schematic, to selectively map the digital output signals DO, x0-x15 delivered by the ADC subcircuit to the mapping circuit to either corresponding primary DACs or a selected calibration DAC, and to selectively map a calibration signal CAL from the calibration signal circuit 86 to any of the primary DACs 110 or the selected calibration DAC 114. FIG. 10 depicts an exemplary embodiment of the mapping circuit 106 configured to selectively map three digital signals. The depicted embodiment can include a plurality of switches 130 configured to selectably exchange digital signals, e.g., the digital output DO, x0-x15 and calibration signals CAL, between selected primary DACs and the a calibration DAC as described herein in response to control signals SEL from the control circuit. Although FIG. 10 depicts a mapping circuit 106 configured to receive three digital output signals x0-x2, other embodiments may receive any number of digital output signals DO by extrapolating the depicted architecture. Additionally, the mapping circuit 106 can optionally instead utilize different architectures than that depicted in FIG. 10. Also, in other embodiments, the injection pipeline stage 54 can implement the mapping circuit 106 or mapping functionality provided by the mapping circuit 106 in a different relative location along the signal flow among the ADC subcircuit 106, primary DACs 110, calibration DACs 114, and summation circuits 118, 122. For example, in an alternative embodiment, the injection pipeline stage can implement the mapping circuit 106 or its equivalent functionality internally to the ADC subcircuit 102.

The injection pipeline stage 54 may include a sufficient number of primary DACs 110 to be able to convert the digital output DO produced by the ADC subcircuit 102 back into an analog form, i.e., to the analog output signal AO, to allow the injection pipeline stage 54 to conduct regular conversion operation, including converting the analog input AI to the predetermined bit-width digital output DO and generating a corresponding amplified analog residue signal AAR, without necessary reliance on the calibration DACs 114 to perform this functionality. This can provide flexibility in the selection and operation in either or both of foreground and background calibration modes. The primary DACs 110 may accept either binary-code or thermometer-code digital outputs DO as input for conversion, and can output intermediate analog output signals y0-y15 at a selected predetermined number of output levels. In FIG. 6, the primary DACs 110 can each be configured to accept as digital input a single thermometer-code digital output signal x0-x15 provided by the ADC subcircuit 102, and output an intermediate analog output signal y0-y-15 having one of two possible analog output signal levels. Thus the plurality of primary DACs 110 can include a number of DACs 110 equal to the number of thermometer-code digital outputs x0-x15 provided by the ADC subcircuit 102, e.g., can include 16 primary DACs 110 for the equivalent of a 4 bit binary-code injection pipeline stage 54, as exemplarily depicted in FIG. 6. In other embodiments, the primary DACs 110 can include DACs 110 configured to accept binary-code digital outputs DO instead of thermometer-code digital outputs DO, as well as accept multiple binary- or thermometer-code signals. The primary DACs 110 may each be an identical circuit.

Each of the primary DACs 110 of a given injection pipeline stage 54 may output an intermediate analog output signal y0-y15 having a magnitude of up to but not greater than a predetermined analog signal magnitude. The predetermined analog signal magnitude, as well as the gain of residue amplifier 126, can be selected so that the amplified analog residue AAR does not exceed, and has a predetermined relationship to, a maximum analog input signal magnitude that a pipeline stage succeeding the selected injection pipeline stage 54 can convert when the pipelined ADC circuit 50 is operating according to ideal behavior. For example, the predetermined analog signal magnitude can be selected so that the amplified analog residue AAR does not exceed one half of the maximum analog input signal magnitude that a succeeding pipeline stage can convert, thereby allowing headroom at the input of the succeeding pipeline stage for various errors and calibration operations, which may superimpose upon the maximum analog output signal magnitude, to prevent exceeding the maximum analog input signal magnitude of the succeeding pipeline stage.

To achieve a predetermined relationship between the maximum analog signal magnitude output by the primary DACs 110 and the maximum analog input signal magnitude of the succeeding pipeline stage, each of the primary DACs 110 may output a maximum intermediate analog output signal magnitude having a predetermined relationship to the analog input resolution step size $\Delta$ of the selected pipeline stage 54, i.e., the smallest gradation in analog input magnitude change that the ADC subcircuit 102 of the selected pipeline stage 54 can detect and convert. In FIG. 6, the primary DACs 110 can each be configured to output a maximum intermediate analog output signal magnitude having a range of the analog input resolution step size $\Delta$ of the selected pipeline stage 54, centered around zero, and thus output a maximum intermediate analog output signal magnitude having a range of plus or minus one-half of the analog input resolution step size $\pm\Delta/2$ of the selected pipeline stage 54. In other embodiments, the primary DACs 110 can each be configured to output a maximum intermediate analog output signal magnitude having a range having a different predetermined relationship to the analog input resolution step size $\Delta$ of the selected pipeline stage 54.

In one embodiment, the injection pipeline stage 54 can include at least two calibration DACs 114. One approach to calibration of the pipelined ADC circuit 50 can include first calibrating the circuit path including the first calibration DAC 114a to account for errors of that path, then utilizing the first calibration DAC 114a to calibrate the circuit path including the second calibration DAC 114b to account for errors in that path, and finally utilizing the first and second calibration DACs 114a, 114b to calibrate the injection stage to account for errors in each of the circuit paths including the primary DACs 110. The first calibration DAC 114a may output a first predetermined maximum intermediate analog output signal magnitude and the second calibration DAC 114b may output a second predetermined maximum intermediate analog output signal magnitude. The first predetermined maximum intermediate analog output signal magnitude can be selected to be different from, e.g., less than, the second predetermined maximum intermediate analog output signal magnitude. The second predetermined maximum intermediate analog output signal magnitude can be selected to have a predetermined relationship to, e.g., be equal to, the maximum intermediate analog output signal magnitude produced by the primary DACs 110, and the second calibration DAC 114b can optionally be configured to be or include the same circuit as each of the primary DACs 110. In FIG. 6, the injection pipeline stage 54 can be configured so that the first predetermined maximum intermediate analog output signal magnitude is plus or minus one-quarter of the analog input resolution step size $\pm\Delta/4$ of the selected pipeline stage, and the second predetermined maximum intermediate analog output signal magnitude is plus or minus one-half of the analog input resolution step size $\pm\Delta/2$ of the selected pipeline stage. As described further below, this predetermined difference in maximum intermediate analog output signal magnitudes of the first and second calibration DACs 114a, 114b can be utilized to enable simultaneous operation of both the first and second calibration DACs 114a, 114b during calibration without exceeding the available input headroom of the succeeding pipeline stage.

The injection pipeline stage 54 can also include the one or more summation circuits 118, 122 and a residue amplifier circuit 126. In FIG. 6, the injection pipeline stage 54 is depicted as including a first summation circuit 118 to produce the overall analog output signal AO of that injection pipeline stage 54 by summing the plurality of intermediate analog output signals y0-y15 produced by the primary and calibration DACs 110, 114, and a second summation circuit 122 to produce the analog residue signal AR for that injection pipeline stage 54 by subtracting the overall analog output signal AO from the analog input signal AI. In embodiments, discussed further below, the first summation circuit 118 can optionally be configured to selectively either add or subtract the output of a selected primary DAC 110 or first calibration DAC 114a from the outputs from the other primary DACs 110 and second calibration DAC 114b to produce the unequal effect of the first and second calibration signals CALA, CALB on the amplified analog residue AAR and corresponding digitized residue DR. The residue amplifier 126 may amplify the analog residue AR signal to produce the amplified analog residue signal AAR. Although FIG. 6 depicts the primary DACs 110, the calibration DACs 114, the one or more summation circuits 118, 122, and the residue amplifier 126 as separate schematic symbols, in some embodiments these circuits can be implemented together in one or more circuits or subcircuits that collectively implement the functions schematically illustrated separately in FIG. 6. For example, the primary and calibration DACs 110, 114 can be implemented together with the summation and amplifier circuits 118, 122, 126 as a multiplying DAC. Other circuit implementations of the functionality of the primary DACs 110, calibration DACs 114, one or more summation circuits 118, 122, and residue amplifier 126 are also possible.

The pipelined ADC circuit 50 having the one or more injection pipeline stages 54 may be calibrated to correct for errors such as residue-amplifier gain errors, DAC component-value mismatch errors, and other DAC path errors. As indicated above, in one embodiment, calibration of the pipelined ADC circuit 50 can include calibrating the circuit paths including first and second calibration DACs 114a, 114b, and utilizing both the first and second calibration DACs 114a, 114b together to calibrate the circuit paths including the primary DACs 110. FIGS. 7 and 8 are flow charts depicting steps of embodiments of methods 700, 800 for operating and calibrating the pipelined ADC circuit 50.

FIG. 7 depicts an embodiment of a method 700 for calibrating a selected injection pipeline stage 54 of the pipelined ADC circuit 50 to account for errors in the calibration DAC circuit paths of that selected injection stage 54. In embodiments of the method 700 of FIG. 7, the circuit path including the first calibration DAC 114a through to the corresponding digitized residue DR of the selected pipeline stage 54 can be calibrated to account for errors in that path, and the circuit path including the second calibration DAC 114b through to the corresponding digitized residue DR of the selected pipeline stage 54 can be calibrated to account for errors in that path. Embodiments of the method 700, or portions thereof, can be performed either in a foreground mode, i.e., not while the selected injection stage 54 is operating to convert an analog input AI, AIN received at the selected injection stage 54 or the pipelined ADC circuit 50 into a digital output DO, DOUT, or in a background mode, i.e., while the selected injection stage 54 is operating to convert an analog input AI, AIN received at the selected injection stage 54 or the pipelined ADC circuit 50 into a digital output DO, DOUT.

A first part of method 700 can calibrate the first calibration DAC path. In step 702, the input to the second calibration DAC 114b can be zeroed. Step 704 can be performed after step 702. In step 704, a calibration signal CALA can be injected into, i.e., supplied as a digital input to, the first calibration DAC 114a. The first calibration signal CALA may be uncorrelated to inputs supplied to any of the primary DACs 110, i.e., uncorrelated to the analog input AI received by the selected stage 54, and thus to any of the digital outputs DO, x0-x15 produced by the ADC subcircuit 102 during regular conversion operation, e.g., when performed in a background mode. This can be accomplished relatively easily in foreground calibration if analog input AI is received and no digital outputs DO are being generated by the ADC subcircuit 102 and supplied as digital inputs to the primary DACs 110. In a background calibration mode, the uncorrelated calibration signal CALA can be selected based on knowledge of the nature and characteristics of the analog input AI and corresponding digital output DO being supplied to the primary DACs 110. The uncorrelated calibration signal CALA can optionally be a pseudo-random digital binary sequence, e.g., in some embodiments having a zero mean, which can be uncorrelated to many types of analog and digital signals. Pseudo-random sequences can optionally be generated by the calibration signal circuit 86 of the estimation and control circuit 74, using known methods, and distributed as calibration signals CAL to the first calibration DAC 114a (or second calibration DAC 114b or primary DACs 110 as discussed elsewhere herein), or received and stored by the calibration signal circuit 86 from another circuit, and then distributed as calibration signals CAL.

Figure 9:
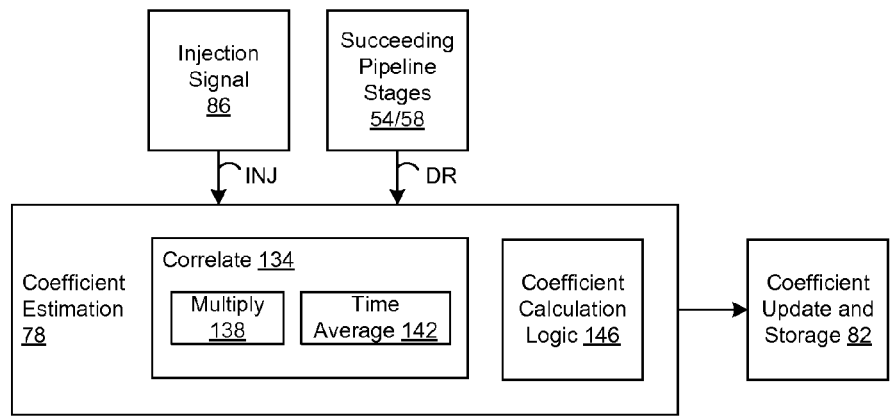
FIG. 9 is a circuit schematic depicting an embodiment of a coefficient estimation circuit of the pipelined ADC circuit depicted in FIGS. 2-4.

In FIG. 7, step 706 can be performed after step 704. In step 706, the digitized residue DR corresponding to the selected injection stage 54 and produced by succeeding pipeline stages 54, 58 can be correlated to the calibration signal CALA, which can be, e.g., the pseudo random sequence uncorrelated to the portion of the digitized residue DR produced by other signals input to the primary DACs 110 of that injection stage 54. The correlation operation can be performed by the coefficient estimation circuit 78 of the estimation and control circuit 74 using known digital signal correlation methods, which can include multiplication and time-averaging operations applied to the two signals to be correlated. FIG. 9 depicts an exemplary embodiment of the coefficient estimation circuit 78. In FIG. 9, the coefficient estimation circuit 78 can include a correlation circuit 134, which can have a multiply circuit 138 and a time average circuit 142, and a logic circuit 146. The correlation circuit 134 may receive the calibration signal CALA, e.g., the uncorrelated pseudo random sequence, injected into the first calibration DAC 114a and the digitized residue DR generated by the succeeding pipeline stages and apply the multiplication and time average functions of the multiply circuit 138 and time average circuit 142 to generate a correlation signal.

In FIG. 7, step 708 can be performed after step 706. In step 708, an calibration DAC error correction coefficient CDECC can be calculated to correct for a errors of the circuit path including the first calibration DAC 114a through to the digitized residue DR corresponding to the selected injection pipeline stage 54. The calibration DAC error correction coefficient CDECC can be calculated using the results of the correlation generated in step 706 and knowledge of the intended gain of calibration DAC path. That is, if the gain is actually as intended, the correlation will produce results having a predetermined magnitude or other detectable property. Likewise, if the gain is incorrect, i.e., not as intended, the correlation results will deviate from the predetermined magnitude or other detectable property. This deviation can be assessed and used to create the calibration DAC error correction coefficient CDECC for the path including the first calibration DAC 114a of the selected injection stage 54. In the embodiment of FIG. 9, the error correction coefficient CDECC can be calculated by the logic circuit 146 of the coefficient estimation circuit 78, implementing this assessment of the correlation results. The calculated error correction coefficient CDECC can be provided by the coefficient estimation circuit 78 to the coefficient update and storage circuit 82.

In a second part of the method 700, which can include steps 710-714, the circuit path including the second calibration DAC 114b can be calibrated to calculate an calibration DAC error correction coefficient CDECC for this path. This part of method 700 is similar to the calibration of the primary DAC paths performed by embodiments of method 800 depicted in FIG. 8, e.g., steps 804-808, and thus will not be described in detail with reference to FIG. 7, but instead the description below in regard to FIG. 8 can by applied to performing the second part of method 700. Briefly, in step 710 the first and second calibration DACs 114a, 114b can be simultaneously provided, i.e., injected, with unequal effect first and second calibration signals CALA, CALB at their inputs. The first and second calibration signals CALA, CALB can be uncorrelated to any concurrently received analog input AI being processed by regular conversion operation of the selected stage 54, but correlated to each other so that they can produce correlated although unequal effects on the digitized residue DR corresponding to the selected pipeline stage 54 (e.g., CALA=−CALB, where CALA and CALB can be chosen from a set represented by {−1, 1}). In step 712, the coefficient estimation circuit 78 can correlate the corresponding digitized residue DR to the injected calibration signals CALA, CALB to determine the injected signals' effect on the digitized residue DR, and thus any deviation from an intended gain of the circuit path through the second calibration DAC 114b, residue amplifier 126 and any succeeding stages 54, 58. This correlation can separate the effect of the calibration signals CALA, CALB on the digitized residue DR from the effect of any other signals generated by the primary DACs 110 during regular conversion operation. In step 714, the coefficient estimation circuit 78 can then generate and pass on a calibration DAC error correction coefficient CDECC to an error correction circuit 66 for use in correcting the digital output DO of the selected pipeline stage 54 for errors in the circuit path including the second calibration DAC 114b. The calibration DAC error correction coefficient CDECC can be calculated using the correlation signal, generated in step 712, knowledge of the intended predetermined gain of the second calibration DAC path, and the previously calculated first calibration DAC error correction coefficient CDECC, generated in step 708.

FIG. 8 depicts an embodiment of a method 800 for calibrating the selected injection pipeline stage 54 of the pipelined ADC circuit 50 to account for errors such as residue amplifier gain errors and DAC component-value mismatch errors of the circuit paths including the primary DACs 110 through to the corresponding digitized residue DR of that injection stage 54. Embodiments of the method 800 of FIG. 8 can be performed either in a background mode, i.e., while the selected injection stage 54 is operating to convert an analog input AI, AIN received at the selected injection stage 54 or the pipelined ADC circuit 50 to a digital output DO, DOUT, or in a foreground mode, i.e., not while the selected injection stage 54 is operating to convert an analog input AI, AIN received at the selected injection stage 54 or the pipelined ADC circuit 50 to a digital output DO, DOUT. Embodiments of the calibration method 700 of FIG. 7 can be optionally performed before embodiments of the calibration method 800 of FIG. 8, and, from one perspective, combination of embodiments of both of the methods 700, 800 of FIGS. 7-8 can be considered to be an overall calibration method, correcting for errors such as gain errors of the residue amplifier 126 and DAC component-value mismatch errors of the primary DACs 110 of the selected injection pipeline stage 54 in both the calibration DAC circuit paths and the primary DAC circuit paths.

In step 802, the second calibration DAC 114b can be operationally exchanged with a selected primary DAC 110. That is, a primary DAC 110 in a primary DAC path selected for calibration can be replaced by the second calibration DAC 114b in the signal flow of the normal conversion operation of the injection stage 54. The exchange of the selected primary DAC 110 with the second calibration DAC 114b can be accomplished using the selective routing functionality of the mapping circuit 106 to route the digital signals normally delivered to the selected primary DAC 110 during non-calibration conversion operation of the injection stage 54 to the second calibration DAC 114b instead. As discussed further below, the mapping circuit can also be used to similarly route second calibration signal CALB to the selected primary DAC 110. As discussed above in regard to the mapping circuit 106, the mapping circuit functionality can optionally be implemented at different points in the digital signal flow among the components of the injection stage 54 such as the ADC sub-circuit 102, primary DACs 110, and summation circuit 118. Thus, the operational exchange of the selected primary DAC 110 with the second calibration DAC 114b can likewise be optionally accomplished according to alternative embodiments of the mapping functionality of the mapping circuit 106.

The calibration of the selected primary DAC path by the method 800 of FIG. 8 can be configured so that the selected injection stage 54 can continue regular data conversion operation due to the operational exchange of the selected primary DAC 110 with the second calibration DAC 114b. That is, the second calibration DAC 114b has been inserted into the place of the selected primary DAC 110 in the regular conversion operation of the injection stage 54, and the pipelined ADC circuit 50 can thus continue to convert an analog input AIN received at the pipelined ADC input to a digital output DOUT while the calibration method 800 of FIG. 8 is performed. To facilitate a seamless operational exchange of the selected primary DAC 110 with the second calibration DAC 114b, the second calibration DAC 114b may operate identically to each of the primary DACs 110, e.g., may be a replica, i.e., a duplicate or the same as, a circuit used to implement each of the primary DACs 110. Thus, the calibration method 800 of FIG. 8 can be performed as either a foreground or background calibration method.

In FIG. 8, step 804 can be performed after step 802. In step 804, first and second calibration signals CALA, CALB can be injected into, i.e., supplied as digital inputs to, the selected primary DAC 110 and the first calibration DAC 114a. The first and second calibration signals CALA, CALB can be correlated to each other but produce unequal effects at the outputs of the selected primary DAC 110 and first calibration DAC 114a, in the amplified analog residue AAR, and in the digitized residue DR. The first and second calibration signals CALA, CALB can be uncorrelated to the analog input AI and thus the digital outputs DO supplied to any of the other primary DACs 110 (i.e., other than the selected primary DAC 110) or second calibration DAC 114b substituting for the selected primary DAC 110. In more detail, a first calibration signal CALA is supplied to the first calibration DAC 114a and a second calibration signal CALB is supplied to the selected primary DAC 110, where the first and second calibration signals CALA, CALB are digital signals each having potential values that have either a positive effect on the output of a DAC, i.e., producing a corresponding positive analog output voltage change from the DAC, or a negative effect on the output of a DAC, i.e., producing a corresponding negative analog output voltage change from the DAC. The calibration signals CALA, CALB can be digital signals with possible values selected to enable creation of opposite effects at the output of a DAC, on the amplified analog residue signal AAR, or digitized residue DR. For example, the calibration signals CALA, CALB can be digital sequences having two possible values, e.g., 0 and 1, or −1 and 1, or other values as a particular circuit may utilize, designed to elicit corresponding correlated (equal or unequal magnitude, as discussed further below) but oppositely-signed analog output voltages from a DAC. The DACs of the injection pipeline stage 54 can optionally be switched-capacitor charge-redistribution style DACs. In such embodiments, the opposite-effect calibration signals CALA, CALB can operate to cause opposite charge injections in the selected primary DAC 110 and first calibration DAC 114a, resulting in an output voltage effect of opposite sign, i.e., positive or negative, on the overall analog output voltage AO produced by the primary DAC 110, first calibration DAC 114a, summation circuit 118 and amplifier circuit 126. In another example, the opposite effect of the calibration signals CALA, CALB, can be produced by generating correlated (equal or unequal magnitude, as discussed further below) but same-sign (i.e., positive or negative) analog output signals at the outputs of the first calibration DAC 114a and selected primary DAC 110, but which outputs can then be treated differently by the summation circuit 118, i.e., one output added by the summation circuit 118 to the analog output sum AO and the other subtracted by the summation circuit 118 from the analog output sum AO.

As indicated above, the primary DACs 110 and second calibration DAC 114b can each include or be composed of the same circuit, e.g., can be replicas of each other, i.e., include the same components and component values. Additionally, the first calibration DAC 114a can also utilize this common DAC circuit. However, the circuit of the first calibration DAC 114a can, while configured to have the same components as the primary and second calibration DACs, be configured to have different component values that produce a different predetermined maximum intermediate analog output signal magnitude than the primary and second calibration DACs 110, 114b. That is, the first calibration DAC 114a may have the first predetermined maximum intermediate analog output signal magnitude, and the second calibration and primary DACs 114b, 110 may have the second predetermined maximum intermediate analog output signal magnitude, where the second maximum intermediate analog output signal magnitude can be different than, e.g., greater than, the first intermediate analog output signal magnitude. For example, in FIG. 6, the injection pipeline stage 54 can be configured so that the first predetermined maximum intermediate analog output signal magnitude of the first calibration DAC 114a be plus or minus one-quarter of the analog input resolution step size ±Δ/4 of the selected pipeline stage, and the second predetermined maximum intermediate analog output signal magnitude of the second calibration DAC 114b and the primary DACs 110 can be plus or minus one-half of the analog input resolution step size ±Δ/2 of the selected pipeline stage.

When the injection pipeline stage 54 is configured so that the first predetermined maximum intermediate analog output signal magnitude of the first calibration DAC 114a is different than, e.g., less than, e.g., one-half of, the second predetermined maximum intermediate analog output signal magnitude of the second calibration DAC 114*b* and the primary DACs 110, the injection of the opposite-effect calibration signals into the first calibration DAC 114*a* and the selected primary DAC 110, respectively, can produce opposite but unequal intermediate analog output voltages at the output of the first calibration DAC 114*a* and selected primary DAC 110, and corresponding opposite but unequal effects upon the overall analog output signal AO, analog residue signal AR, amplified analog residue signal AAR and corresponding digitized residue DR of the selected injection pipeline stage 54. In the instance, as depicted in FIG. 6, where the first predetermined maximum intermediate analog output signal magnitude is plus or minus one-quarter of the analog input resolution step size $\pm\Delta/4$ of the selected pipeline stage, and the second predetermined maximum intermediate analog output signal magnitude is plus or minus one-half of the analog input resolution step size $\pm\Delta/2$ of the selected pipeline stage, the injection of the opposite-effect calibration signals injected into the first calibration DAC 114*a* and the selected primary DAC 110 can result in a combined calibration signal producing a sum of the intermediate analog outputs from the first calibration DAC 114*a* and the selected primary DAC 110 having a maximum intermediate analog output signal magnitude of plus or minus one-quarter of the analog input resolution step size $\pm\Delta/4$ of the selected pipeline stage. That is, by itself, such an first calibration signal CALA injected into a selected $\pm\Delta/4$ first calibration DAC 114*a* would result a maximum intermediate analog output signal magnitude of plus or minus one-quarter of the analog input resolution step size $\pm\Delta/4$ of the selected pipeline stage, and, by itself, such a second calibration signal CALB injected into a selected $\pm\Delta/2$ primary DAC 110 would result in a maximum intermediate analog output signal magnitude of plus or minus one-half of the analog input resolution step size $\pm\Delta/2$ of the selected pipeline stage. But, because the first and second calibration signals CALA, CALB may have oppositely signed effect, they have opposite but unequal effect, and the resulting intermediate analog output signals from the first calibration DAC 114*a* and selected primary DAC 110 partially cancel each other, to produce a sum of the two intermediate analog outputs equaling plus or minus one-quarter of the analog input resolution step size $\pm\Delta/4$ of the selected pipeline stage. Put more simply, the first calibration signal CALA results in a $\pm\Delta/4$ intermediate analog output signal, the second calibration signal CALB results in an oppositely-signed $\pm\Delta/2$ intermediate analog output signal, and the sum will therefore equal a $\pm\Delta/4$ intermediate analog output signal.

The effect of the partial cancellation of the opposite-effect calibration signals provided to the first calibration DAC 114*a* and selected primary DAC 110 is to reduce the calibration signal overhead burden presented to the succeeding pipeline stage. If the second calibration signal CALB is provided to the selected primary DAC 110 alone, then a resulting $\pm\Delta/2$ intermediate analog output signal may consume most of or the entire available free input overhead of the succeeding pipeline stage, and leave little or no remaining input overhead available to accommodate other errors or possible system events without pushing the succeeding pipeline stage into input overload. In embodiments of the method 800 of FIG. 8, by contrast, simultaneous calibration signals CALA, CALB can be supplied to the first calibration DAC 114*a* and selected primary DAC 110, producing oppositely signed but unequal-magnitude corresponding intermediate analog output signals or effects on the amplified analog residue AAR, thereby reducing the overall sum of the intermediate analog output signals from the first calibration DAC 114*a* and selected primary DAC 110 or amplified analog residue AAR and preserving input overhead of the succeeding pipeline stage.

Figure 15:
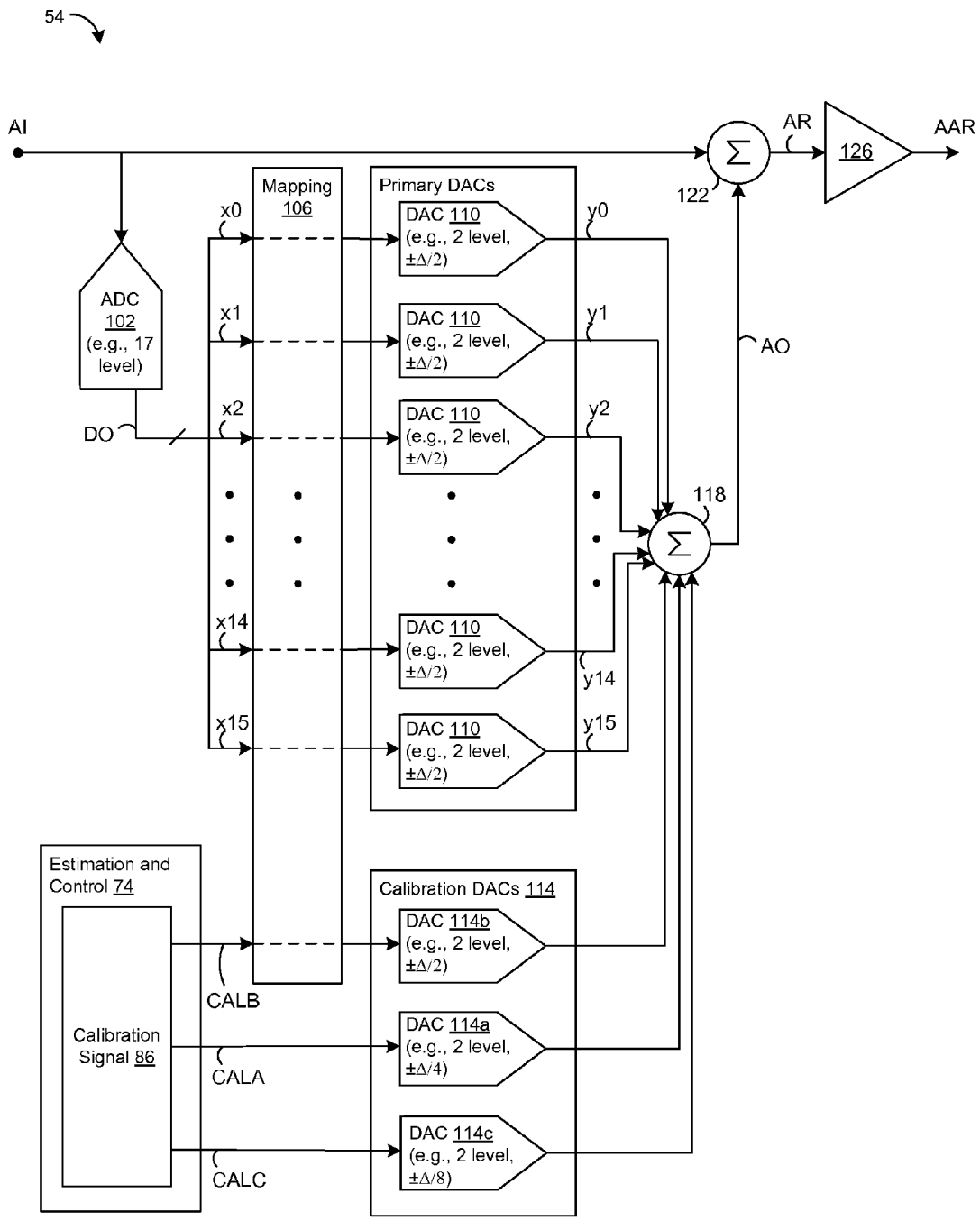
FIG. 15 is a circuit schematic depicting another embodiment of the injection pipeline stage of the pipelined ADC circuit depicted in FIGS. 2-4.

Although embodiments have been discussed above in which the first calibration DAC 114*a* and the selected primary DAC 110 respectively have a $\pm\Delta/4$ maximum intermediate analog output signal magnitude and a $\pm\Delta/2$ maximum intermediate analog output signal magnitude, and are injected with opposite-effect calibration signals, e.g., equal but opposite-effect calibration signals, other embodiments are possible which also produce the desired effect of a reduced overall sum of the intermediate analog output signals from the first calibration DAC 114*a* and selected primary DAC 110 and preserved input overhead of the succeeding pipeline stage. For example, the first calibration DAC 114*a* and selected primary DAC 110 can optionally have equal maximum intermediate analog output signal magnitudes, but be injected with unequal but opposite-effect calibration signals CALA, CALB, e.g., unequal but oppositely-signed calibration signals CALA, CALB that produce unequal but oppositely-signed intermediate analog output signals, thereby also resulting in a reduced overall sum of the intermediate analog output signals from the first calibration DAC 114*a* and selected primary DAC 110 and preserved input overhead burden to the succeeding pipeline stage. Other embodiments, which selectively utilize equal or unequal opposite-effect calibration signals and equal or unequal maximum intermediate analog output signal magnitudes of the first calibration and primary DACs 114*a*, 110, and which produce the reduced overall analog output signal sum from the first calibration DAC 114*a* and selected primary DAC 110 and reduced input overhead burden to the succeeding pipeline stage, are also possible. In one embodiment, the pipelined ADC 50 can include more than two calibration DACs 114, e.g., three or more calibration DACs 114, with varying maximum output magnitudes, to selectively control the overall size of the amplified analog residue AAR provided to the succeeding pipeline stage 54, 58. FIG. 15 depicts one embodiment of an injection stage 54 of the pipelined ADC that can be used to this effect.

In FIG. 8, step 806 can be performed after step 804. In step 806, the digitized residue DR corresponding to the selected pipeline stage 54 and produced by the succeeding pipeline stages 54, 58 can be correlated to the calibration signals CALA, CALB injected into the first calibration DAC 114*a* and selected primary calibration DAC 110. The correlation operation can be performed by the coefficient estimation circuit 78 of the estimation and control circuit 74 using known digital signal correlation methods, which can include multiplication and time averaging operations applied to the two signals to be correlated. As discussed above, FIG. 9 depicts an embodiment of the coefficient estimation circuit 78. The correlation circuit 134 of the coefficient estimation circuit 78 may receive the calibration signals CALA, CALB provided to the selected injection stage 54 and the digitized residue DR from the succeeding pipeline stages and apply multiplication and time average functions of the multiply circuit 138 and time average circuit 142 to generate a correlation signal. While the correlation circuit 134 may receive and utilize both the first and second calibration signals CALA, CALB to perform the correlation, because the first and second calibration signals CALA, CALB are related to each other, the correlation circuit 134 can optionally perform the correlation using only one or the other of the first and second calibration signals CALA, CALB. In an alternative embodiment, in step 806, the digital output DO of one of the succeeding pipeline stages 54, 58, instead of or in addition to the digitized residue DR, can be correlated to the calibration signals CALA, CALB injected into the first calibration DAC 114*a* and selected primary calibration DAC 110.

In FIG. 8, step 808 can be performed after step 806. In step 808, a primary DAC error correction coefficient PDECC can be calculated to correct for errors such as gain errors and component value mismatch errors of the circuit path including the selected primary DAC 110 of the selected injection pipeline stage 54. The primary DAC error correction coefficient PDECC can be calculated using the correlation signal, generated in step 806, knowledge of the intended predetermined gain of the primary DACs path, and the previously calculated first calibration DAC error correction coefficient CDECC, generated in embodiments of the method 700 depicted in FIG. 7, e.g., in step 708. That is, if the gain of the selected primary DAC path is correct, i.e., as intended, the correlation signal will have a predetermined magnitude or other detectable property, and if it is incorrect, i.e., deviates from as intended, the correlation signal will deviate from the predetermined magnitude or other detectable property. This deviation can be assessed and used to create the primary DAC error correction coefficient PDECC for correcting errors of the selected primary DAC path. In FIG. 9, the logic circuit 146 of the coefficient estimation circuit 78 can be used to implement this assessment and calculate the primary DAC error correction coefficient PDECC. The calculated error correction coefficient PDECC can be provided by the coefficient estimation circuit 78 to the coefficient update and storage circuit 82. The method 800 of FIG. 8 can then be repeated for some or all of the plurality of primary DAC circuit paths, as is desired, to calculate error correction coefficients PDECC for some or all of these paths.

Figure 11:
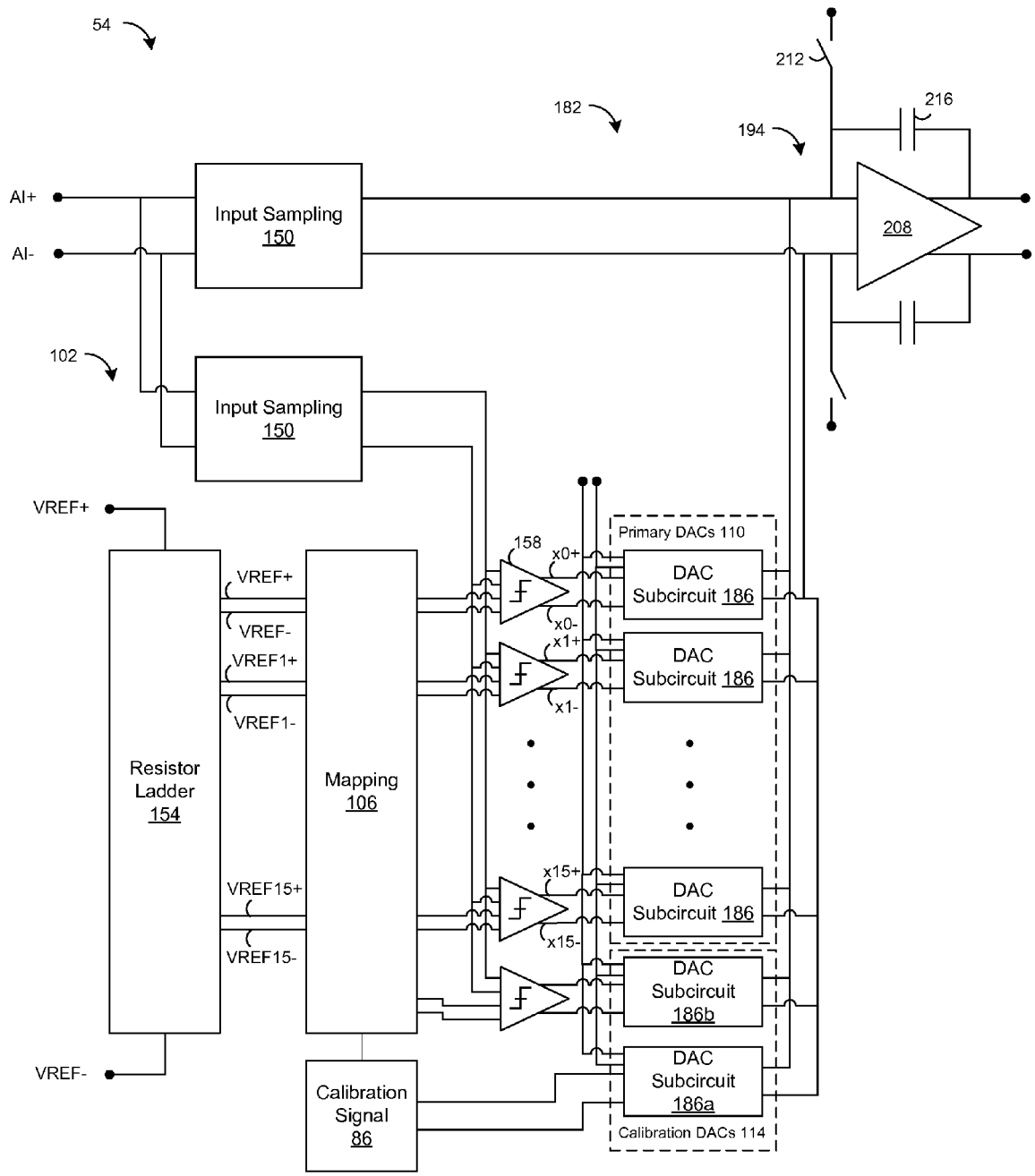
FIG. 11 is a circuit schematic depicting another embodiment of the injection pipeline stage of the pipelined ADC circuit depicted in FIGS. 2-4.

FIG. 11 depicts another embodiment of the injection pipeline stage 54 of the pipelined ADC circuit 50. As depicted, the injection pipeline stage 54 is configured to convert a differential analog input signal AI+–AI–. Additionally, in FIG. 11, the ADC subcircuit 102 is implemented as a flash ADC, which can include an input sampling circuit 150, a resistor ladder 154, and a plurality of comparators 158. Note that, however, in other embodiments, the injection stage 54 may convert either a differential or single-ended analog input signal AI, and the ADC subcircuit 102 can be implemented using other types of ADC architectures instead of or in addition to a flash ADC architecture.

Figure 12:
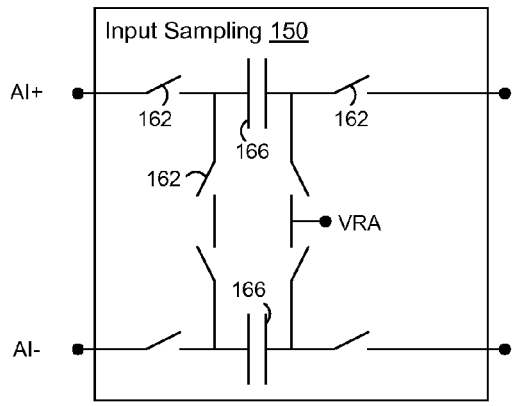
FIG. 12 is a circuit schematic depicting an embodiment of an input sampling circuit of the injection pipeline stage depicted in FIG. 11.

FIG. 12 depicts an embodiment of the input sampling circuit 150 that can include one or more switches 162 and one or more capacitors 166 configured to receive and sample the analog input signal AI+–AI– and provided the sampled analog input signal AI+–AI– to the plurality of comparators 158. The input sampling circuit 150, including the switches 162 of the input sampling circuit 150, may receive clock or other control signals and a reference voltage VRA from the estimation and control circuit 74 to control the switching on and off of the switches 162 to control the receipt and sampling of the analog input signal AI+–AI– and providing of the sampled analog input signal AI+–AI– to the plurality of comparators 158. Other embodiments of the input sampling circuit 150 are possible, e.g., having different configurations of switches 162 and capacitors 166. Embodiments of the ADC subcircuit 102 may also omit inclusion of an input sampling circuit 150 altogether. For example, embodiments of the ADC subcircuit 102 can instead provide the analog input signal AI+–AI– directly to the plurality of comparators 158 or include a sampling functionality within the comparators 158.

Figure 13:
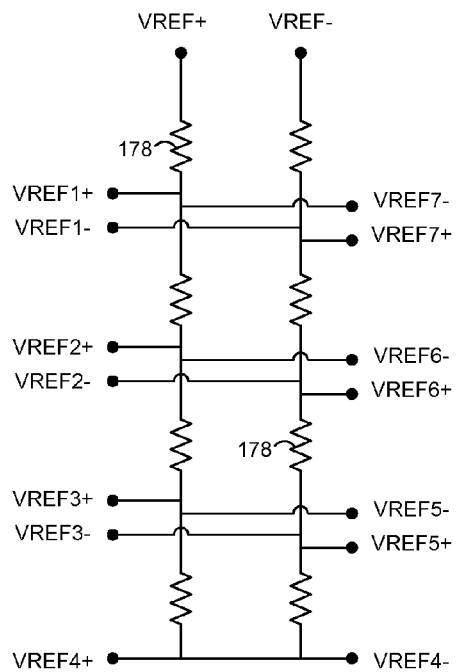
FIG. 13 is a circuit schematic depicting an embodiment of a resistor ladder of the injection pipeline stage depicted in FIG. 11.

FIG. 13 depicts an embodiment of the resistor ladder 154, which can include a plurality of resistances 178 arranged in series. The resistor ladder 154 may receive an overall reference voltage VREF+–VREF– across the series combination of resistors 170, generate a plurality of intermediate reference voltages VREF1+–VREF1–, . . . , VREF7+–VREF7– at equally spaced intervals across the span of the overall reference voltage VREF+–VREF–, and provide the reference voltages VREF+–VREF–, VREF1+–VREF1–, . . . , VREF7+–VREF7– to the plurality of comparators 158. Note that, while FIG. 11 corresponds to the equivalent of a 4 bit binary-code injection stage 54, for simplicity, FIG. 13 depicts an embodiment of the resistor ladder that can be used in the equivalent of a 3 bit binary-code injection stage 54. However, the exemplary resistor ladder architecture of FIG. 13 can be expanded by extrapolation of its design principles to be used with any bit-width injection stage 54. Other embodiments of the resistor ladder 154 are also possible. For example, the individual intermediate reference voltages VREF1+–VREF1–, . . . , VREF7+–VREF7– can be defined by tapping different combinations of positions on the resistor ladder 154, and the plurality of resistances 170 can be arranged differently relative to each other in the resistor ladder 154.

Returning to FIG. 11, the plurality of comparators 158 may receive the sampled analog input voltage AI+–AI– and the reference voltages VREF+–VREF–, VREF1+–VREF1–, . . . , VREF15+–VREF15–, and generate the plurality of thermometer-code digital output signals x0+–x0–, . . . , x15+–x15–. As discussed above, the mapping circuit 106 can be located at different positions along the signal flow path of the injection pipeline stage 54. For example, the mapping circuit 106 can be located internally to the ADC subcircuit 102, e.g., as depicted in FIG. 11, connected in the signal flow path between the resistor ladder 154 and plurality of comparators 158.

In FIG. 11, the primary DACs 110, first and second calibration DACs 114*a*, 114*b*, the first summation circuit 118 and the residue amplifier 126 can be collectively implemented as a multiplying DAC circuit 182, and the second summation circuit 122 can be implemented as an input sampling network 150 feeding into the multiplying DAC circuit 182. The multiplying DAC circuit 182 can include a plurality of DAC subcircuits 186 and an amplifier circuit 194. In the depicted embodiment, the primary DACs 110 can be implemented by the plurality of DAC subcircuits 186 in combination with the amplifier circuit 194, the first and second calibration DACs 114*a*, 114*b* can be implemented by the plurality of DAC subcircuits 186*a*, 186*b* in combination with the amplifier circuit 194, the first summation circuit 118 can be implemented by interconnection of the DAC subcircuits 186 to the amplifier circuit 194 and the residue amplifier 126 can be implemented by the amplifier circuit 194. Although in FIG. 11, the primary DACs 110, calibration DACs 114, first summation circuit 118, second summation circuit 122, and residue amplifier 126 can be collectively implemented as a multiplying DAC circuit 182 and an input sampling network 150 feeding into the multiplying DAC circuit 182, in other embodiments the primary DACs 110, calibration DACs 114, the first summation circuit 118, second summation circuit 122, and residue amplifier 126 can be variously implemented as separate individual circuits or collectively, either entirely or partially, as portions or entire embodiments of other circuit embodiments.

Figure 14:
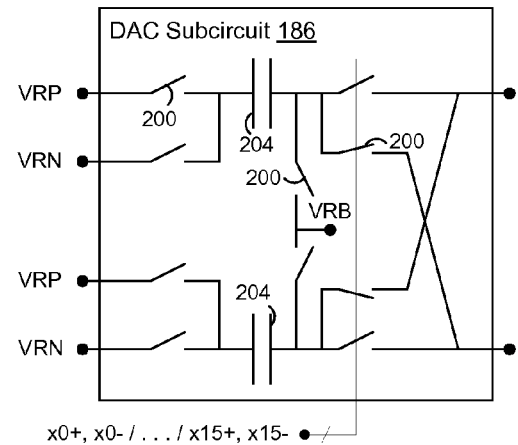
FIG. 14 is a circuit schematic depicting an embodiment of a DAC subcircuit of the injection pipeline stage depicted in FIG. 11.

FIG. 14 depicts an embodiment of the DAC subcircuit 186 (i.e., 186, 186*a*, 186*b*) that can be used to implemented the primary DACs 110 and calibration DACs 114. In FIG. 14, the DAC subcircuit 186 can include one or more switches 200 and one or more capacitors 204 configured to receive the digital output signal x0+–x0–, . . . , x15+–x15– and generate a charge injection signal that can be delivered to the amplifier circuit 194 to produce the amplified analog residue signal AAR. The switches 200 may receive the digital output signal x0+-x0-, . . . , x15+-x15-, and clock or other control signals from the estimation and control circuit 74, as well as reference voltages VRP, VRN, VRB to control the generation of the charge injection signal that can be delivered to the amplifier circuit 194. The DAC subcircuit 186 can be tailored to respectively implement the primary DACs 110 and calibration DACs 114 by selection of the capacitance values of capacitors of the DAC subcircuit 186 to implement the predetermined maximum intermediate analog output magnitudes of the primary DACs and calibration DACs. For example, the DAC subcircuit 186 can be tailored to implement the first predetermined maximum intermediate analog output magnitudes of the primary DACs 110 and second calibration DAC 114*b*, e.g., at plus or minus one-half of the analog input resolution step size $\pm\Delta/2$ of the selected pipeline stage, by selection of the capacitance values of capacitors of the corresponding DAC subcircuit 186 to have a unit capacitance denoted by C. The DAC subcircuit 186 can then be tailored to implement the second predetermined maximum intermediate analog output magnitudes of the first calibration DAC 114*b*, e.g., at plus or minus one-quarter of the analog input resolution step size $\pm\Delta/4$ of the selected pipeline stage, by selection of the capacitance values of capacitors of the corresponding DAC subcircuit 186 to have one half the unit capacitance denoted by C, i.e., a capacitance value denoted by C/2. In a similar vein, other values of and relationships between the predetermined maximum intermediate analog output magnitudes of the primary DACs 110 and calibration DACs 114 can be implemented by selection of capacitance values, of the respective DAC subcircuits 186, having a corresponding or related relationship. Note that, although the DAC subcircuit 186 depicted in FIG. 14 is configured to include two capacitors 204, other embodiments of the DAC subcircuit may include one or any other number of capacitors 204, and the DAC subcircuit 186 can be tailored to implement the predetermined maximum intermediate analog output magnitudes of the primary and calibration DACs 110, 114 by selection of a single or corresponding number of capacitance values of the capacitors 204. Note also that variations in capacitance values of the capacitors 200, as well as characteristics of the switches 204, among the various DAC subcircuits 186 used to implement the primary DACs 110 can be some of the component value mismatches that the embodiments of the method 800 of FIG. 8 can generate error correction coefficients to correct. Other embodiments of the DAC subcircuit 186 are possible, such as which sample the inputs AI+ and AI– on one clock phase, and VRP and VRN on another clock phase.

The amplifier circuit 194 may receive, combine and amplify charge calibration signals from the plurality of DAC subcircuits 186 and the input sampling circuit 150 implementing the second summation circuit 122 to generate the amplified analog residue signal AAR. In FIG. 11, the amplifier circuit can include an amplifier 208, one or more switches 212 and one or more capacitors 216. The switches 212 may receive clock or other control signals from the estimation and control circuit 74 to control the receipt of the charge calibration signals and generation of the amplified analog residue signal AAR.

Embodiments of the injection pipeline stage 54 of the pipelined ADC circuit 50 can optionally include a different number of calibration DACs 114 than the two calibration DACs 114 exemplarily depicted in FIG. 6. FIG. 15 depicts another embodiment of the injection pipeline stage 54 having three calibration DACs 114. In FIG. 15, a third calibration DAC 114*c* may output a third predetermined maximum intermediate analog output signal magnitude. The third predetermined maximum intermediate analog output signal magnitude can be selected to be different than, e.g., less than, the first and second predetermined maximum intermediate analog output signal magnitudes. In FIG. 15, the injection pipeline stage 54 can be configured so that the third predetermined maximum intermediate analog output signal magnitude is plus or minus one-eight of the analog input resolution step size $\pm\Delta/8$ of the selected pipeline stage, while the first and second predetermined maximum intermediate analog output signal magnitudes are plus or minus one-half and plus or minus one-quarter of the analog input resolution step size $\pm\Delta/2$, $\pm\Delta/4$, respectively, of the selected pipeline stage.

The plurality of calibration DACs 114, e.g., the two calibration DACs 114*a*, 114*b* depicted, e.g., in FIG. 6, or the three calibration DACs 114*a*, 114*b*, 114*c* depicted in FIG. 15, may operate according to a selected one or more operating modes. The estimation and control circuit 74 may store operating instructions pertaining to, and select from among, the plurality of operating modes. For example, the second and third calibration DACs 114*b*, 114*c* can be used collectively in place of the second calibration DAC 114*b* in embodiments of the methods 700, 800 described above to provide more selectability of the magnitude of the output of these calibration DACs 114*b*, 114*c*, and thus their impact on the headroom of the succeeding pipeline stage 54, 58. This mode of operation can also be extended to utilize more than three calibration DACs 114.

Returning to FIGS. 2-4, calibration of the overall pipelined ADC circuit 50 can optionally be conducted in a serial nature, with individual stages being calibrated one at a time, serially from the least-significant-bit stage of the pipelined ADC circuit 50 to the most-significant-bit stage of the pipelined ADC circuit 50. In such a calibration procedure, in FIGS. 2-4, pipeline stages 58 (3-X) would first be calibrated, if such stages were being calibrated, then the second injection pipeline stage 54 (2) would be calibrated, and finally the first injection pipeline stage 54 (1) would be calibrated. In this fashion, the more significant-bit pipeline stages, e.g., first and second injection pipeline stages 54 (1) and (2), can be calibrated using the digitized residue DR received from succeeding pipeline stages that has already been calibrated to the fullest intended extent. Note that the impact of calibration of the less-significant-bit pipeline stages, e.g., pipeline stages 58 (3-X), on the performance metrics of the pipelined ADC circuit 50 may be less than that of the more-significant-bit pipeline stages, e.g., injection pipeline stages 54 (1) and (2), and thus the less-significant-bit pipeline stages can optionally not be calibrated.

Figure 16:
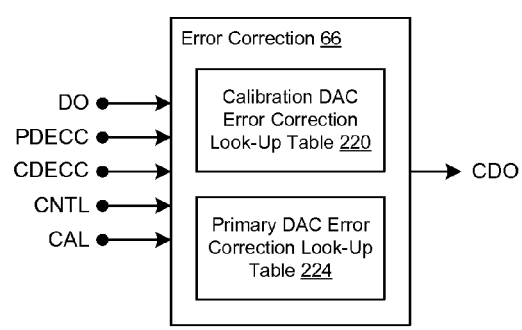
FIG. 16 is a circuit schematic depicting an embodiment of an error correction circuit of the pipelined ADC circuit depicted in FIGS. 2-4.

FIG. 16 depicts an embodiment of the error correction circuit 66. The error correction circuit 66 can include a calibration DAC error correction look-up table 220 configured to provide a corrected digital output CDO for a corresponding injection pipeline stage 54, correcting for errors in the calibration DAC paths, based on the uncorrected digital output DO (or delayed digital output DDO) of that injection stage 54, the calibration DAC gain error correction coefficients CDGECC corresponding to that stage, and a control signal CNTL from the estimation and control circuit 74. The error correction circuit 66 can also include a primary DAC error correction look-up table 224 configured to provide a corrected digital output DO of a selected injection pipeline stage 54, correcting for errors in the primary DAC paths, based on the uncorrected digital output DO (or delayed digital output DDO) of that injection stage 54, the primary DAC error correction coefficients PDECC, and the control signal CNTL from the estimation and control circuit 74. The error correction circuit 66 can also be configured to subtract from the digital output DO a requisite signal based on the calibration signals CAL to remove the effect of these signals CAL from the digital output DO during background calibration modes. The error correction circuit 66 and the form of the calibration DAC error correction and primary DAC error correction look-up tables 220, 224 can be configured so that the error correction circuit 66 can combine the output of the two look-up tables 220, 224 to produce a single corrected digital output CDO for the selected injection pipeline stage 54. The look-up tables 220, 224 may include circuits and operate according to circuits and methods of operation known in the art for look-up tables. For example, the look up tables 220, 224 can each optionally include digital circuit structures implementing one or more of: an array, an associative array, a linked list, or a hash function. In another embodiment, the two look-up tables 220, 224 can be combined into a single lookup table accepting some or all of the inputs described above for operation of the two separate look-up tables 220, 224. As descried above, the error correction coefficients ECC can optionally take the form of digital words of predetermined bit lengths, or any other form for encoding quantitative values for use by digital circuits.

Additional embodiments of the pipelined ADC circuit 50 and injection pipeline stage 54 are possible. For example, any feature of any of the embodiments of the pipelined ADC circuit 50 or injection pipeline stage 54 described herein can optionally be used in any other embodiment of the pipelined ADC circuit 50 or injection pipeline stage 54. Also, embodiments of the pipelined ADC circuit 50 and injection pipeline stage 54 can optionally include any subset of the components or features of the pipelined ADC circuit 50 and injection pipeline stage 54 herein.

What is claimed is:

1. An analog-to-digital converter circuit, comprising:
    a pipeline stage having an analog-to-digital converter to convert an analog input to a digital output, a first plurality of digital-to-analog converters (DACs) to produce an analog output corresponding to the digital output, and a second plurality of DACs configured to have their output added into the analog output;
    a calibration signal circuit to provide first and second calibration signals to inputs of a selected one of the first plurality of DACs and one of the second plurality of DACs; and
    a correction circuit to correct the digital output of the pipeline stage for errors based on results of providing the first and second calibration signals.

2. The analog-to-digital converter circuit of claim 1, further comprising a mapping circuit to selectively exchange inputs between the selected one of the first plurality of DACs and another of the second plurality of DACs.

3. The analog-to-digital converter circuit of claim 1, wherein the first and second calibration signals are substantially uncorrelated to the analog input and digital output of the pipeline stage.

4. The analog-to-digital converter circuit of claim 1, wherein the correction circuit corrects the digital output for gain errors and component-value mismatch errors in the first and second plurality of DACs.

5. The analog-to-digital converter circuit of claim 1, further comprising a succeeding converter portion, wherein the succeeding converter portion is a succeeding pipeline stage.

6. The analog-to-digital converter circuit of claim 1, wherein the effect on an amplified analog residue of the pipeline stage by the first and second calibration signals, upon travelling through the selected one of the first plurality of DACs and the one of the second plurality of DACs, at least partially offset each other.

7. The analog-to-digital converter circuit of claim 1, further comprising a coefficient estimation circuit to calculate at least one error correction coefficient, based on a correlation of the first or second calibration signals to a second digital output of a succeeding converter portion or a signal based on the second digital output, to correct for circuit path errors in at least one of the first plurality of DACs.

8. The analog-to-digital converter circuit of claim 7, wherein the correction circuit corrects the digital output for circuit path errors in the second plurality of DACs based on the results of the correlation, and the coefficient estimation circuit calculates at least one second error correction coefficient, based on the correlation, to correct for errors in at least one of the second plurality of DACs.

9. The analog-to-digital converter circuit of claim 1, wherein the calibration signal circuit provides the first and second calibration signals in a background mode during operation of the pipeline stage to convert the analog input to the digital output.

10. The analog-to-digital converter circuit of claim 1, wherein the calibration signal circuit provides the first and second calibration signals in a foreground mode not during operation of the pipeline stage to convert the analog input to the digital output.

11. The analog-to-digital converter circuit of claim 1, wherein the second plurality of DACs includes a first calibration DAC and a second calibration DAC, the second calibration DAC having component values and a maximum analog output magnitude of the same size as those of the first plurality of DACs, and the first calibration DAC having component values and a maximum analog output magnitude of a smaller size than those of the first plurality of DACs.

12. A method of error correcting in an analog-to-digital converter circuit, comprising:
    providing first and second calibration signals to inputs of a selected one of a first plurality of DACs and one of a second plurality of DACs of a pipeline stage of a converter circuit,
    wherein the pipeline stage includes an analog-to-digital converter to convert an analog input to a digital output, the first plurality of DACs produce an analog output corresponding to the digital output, and the second plurality of DACs have their output added into the analog output; and
    correcting the digital output for errors based on results of providing the first and second calibration signals.

13. The method of claim 12, further comprising selectively exchanging inputs to the selected one of the first plurality of DACs and another of the second plurality of DACs.

14. The method of claim 12, wherein the first and second calibration signals are substantially uncorrelated to the analog input and digital output of the pipeline stage.

15. The method of claim 12, wherein the correcting corrects the digital output for gain errors and component-value mismatch errors in the first and second plurality of DACs.

16. The method of claim 12, wherein the effect on an amplified analog residue of the pipeline stage by the first and second calibration signals, upon travelling through the selected one of the first plurality of DACs and the one of the second plurality of DACs, at least partially offset each other.

17. The method of claim 12, further comprising calculating at least one error correction coefficient, based on a correlation of the first or second calibration signals to a second digital output of a succeeding converter portion or a signal based on the second digital output, to correct for errors in at least one of the first plurality of DACs.

18. The method of claim 12, further comprising correcting the digital output for circuit path errors in the second plurality of DACs.

19. The method of claim 12, wherein the first and second calibration signals are provided in a background mode during operation of the pipeline stage to convert the analog input to the digital output.

20. The method of claim 12, wherein the first and second calibration signals are provided in a foreground mode not during operation of the pipeline stage to convert the analog input to the digital output.

21. The method of claim 12, wherein the second plurality of DACs includes a first calibration DAC and a second calibration DAC, the second calibration DAC having component values and a maximum analog output magnitude of the same size as those of the first plurality of DACs, and the first calibration DAC having component values and a maximum analog output magnitude of a smaller size than those of the first plurality of DACs.

22. The analog-to-digital converter circuit of claim 1, wherein the first and second calibration signals are correlated to each other and have unequal effects on an amplified analog residue of the pipeline stage.

23. The analog-to-digital converter circuit of claim 1, wherein the correction circuit corrects the digital output of the pipeline stage for errors based on results of a correlation of the first or second calibration signals to a second digital output produced by a succeeding converter portion or a signal based on the second digital output.

24. The method of claim 12, wherein the first and second calibration signals are correlated to each other and have unequal effects on an amplified analog residue of the pipeline stage.

25. The method of claim 12, wherein the correction circuit corrects the digital output of the pipeline stage for errors based on results of a correlation of the first or second calibration signals to a second digital output produced by a succeeding converter portion or a signal based on the second digital output.

26. An analog-to-digital converter circuit, comprising:
means for converting an analog input to a digital output using a first plurality of digital-to-analog converters (DACs) to produce an analog output corresponding to the digital output;
means for adding outputs of a second plurality of DACs into the analog output;
means for providing first and second calibration signals to inputs of a selected one of the first plurality of DACs and one of the second plurality of DACs; and
means for correcting the digital output based on results of providing the first and second calibration signals.

27. The analog-to-digital converter circuit of claim 26, wherein the first and second calibration signals are correlated to each other and have unequal effects on an amplified analog residue.

28. The analog-to-digital converter circuit of claim 26, wherein the means for correcting corrects the digital output based on results of a correlation of the first or second calibration signals to another digital output produced as a function of the digital output or a signal based on the another digital output.

29. The analog-to-digital converter circuit of claim 26, further comprising a means to selectively exchange inputs between the selected one of the first plurality of DACs and another of the second plurality of DACs.

30. The analog-to-digital converter circuit of claim 26, wherein the first and second calibration signals are substantially uncorrelated to the analog input and digital output.

* * * * *